(12) United States Patent  
Kinoshita

(10) Patent No.: US 8,269,883 B2
(45) Date of Patent: Sep. 18, 2012

(54) SOLID IMAGE CAPTURE DEVICE AND ELECTRONIC DEVICE INCORPORATING SAME

(75) Inventor: Kazuo Kinoshita, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 713 days.

(21) Appl. No.: 12/319,408

(22) Filed: Jan. 7, 2009

(65) Prior Publication Data

US 2009/0180013 A1    Jul. 16, 2009

(30) Foreign Application Priority Data

Jan. 10, 2008  (JP) ................................ 2008-003701
Jan. 10, 2008  (JP) ................................ 2008-003704

(51) Int. Cl.
  *H04N 5/225* (2006.01)
  *H01L 23/48* (2006.01)
  *H05K 5/00* (2006.01)
(52) U.S. Cl. ......... 348/374; 348/376; 257/688; 361/759
(58) Field of Classification Search .................. 348/340, 348/373–376; 250/208.1; 257/688, 689; 361/759; 438/64, 65, 116
  See application file for complete search history.

(56) References Cited

U.S. PATENT DOCUMENTS

| 5,302,778 | A | * | 4/1994 | Maurinus | ...................... 174/521 |
| 5,559,556 | A | * | 9/1996 | Kagebeck | ...................... 348/374 |
| 6,122,009 | A |   | 9/2000 | Ueda | |
| 6,696,738 | B1 |   | 2/2004 | Tu et al. | |
| 7,422,382 | B2 |   | 9/2008 | Seo | |
| 7,579,583 | B2 |   | 8/2009 | Mok et al. | |
| 7,733,408 | B2 | * | 6/2010 | Tsukamoto et al. | .......... 348/340 |
| 2002/0154239 | A1 |   | 10/2002 | Fujimoto et al. | |
| 2003/0137595 | A1 | * | 7/2003 | Takachi | ......................... 348/340 |
| 2004/0164981 | A1 |   | 8/2004 | Fujita et al. | |
| 2004/0239793 | A1 | * | 12/2004 | Lu et al. | ......................... 348/340 |
| 2005/0212947 | A1 |   | 9/2005 | Sato et al. | |
| 2005/0270405 | A1 |   | 12/2005 | Tanida et al. | |
| 2006/0221225 | A1 |   | 10/2006 | Tsukamoto et al. | |
| 2007/0035647 | A1 |   | 2/2007 | Inuiya | |
| 2007/0267712 | A1 |   | 11/2007 | Fujita et al. | |
| 2008/0099866 | A1 |   | 5/2008 | Chang et al. | |
| 2008/0277752 | A1 |   | 11/2008 | Fujita et al. | |

FOREIGN PATENT DOCUMENTS

| JP | 1-57710 U | 4/1989 |
| JP | 05-259424 | 10/1993 |
| JP | 9-284617 | 10/1997 |

(Continued)

OTHER PUBLICATIONS

U.S. Appl. No. 12/322,949, Kazuo Kinoshita.

*Primary Examiner* — Daniel M Pasiewicz
(74) *Attorney, Agent, or Firm* — Edwards Wildman Palmer LLP; George W. Neuner

(57) ABSTRACT

The solid image capture device 100 in accordance with the present invention is detachably fixed to a wiring board 1 and applies pressure to the side faces of a transparent lid section 3 in a direction normal to the faces, so as to nip and secure the transparent lid section 3. The mechanism allows a solid image capture element 2 to be attached to and detached from the wiring board 1. The solid image capture element 2 is readily positioned precisely on the wiring board 1.

8 Claims, 25 Drawing Sheets

FOREIGN PATENT DOCUMENTS

| | | |
|---|---|---|
| JP | 11-261861 | 9/1999 |
| JP | 11-331659 | 11/1999 |
| JP | 2001-021976 | 1/2001 |
| JP | 2001-188155 | 7/2001 |
| JP | 2002-281400 | 9/2002 |
| JP | 2002-320150 | 10/2002 |
| JP | 2003-046824 | 2/2003 |
| JP | 2003-319217 | 11/2003 |
| JP | 2004-055959 | 2/2004 |
| JP | 2004-296453 | 10/2004 |
| JP | 2005-121912 | 5/2005 |
| JP | 2005-176185 | 6/2005 |
| JP | 2005-348275 | 12/2005 |
| JP | 2006-222501 | 8/2006 |
| JP | 2007-049369 | 2/2007 |
| JP | 2007-49458 | 2/2007 |

* cited by examiner

SOLID IMAGE CAPTURE DEVICE AND ELECTRONIC DEVICE INCORPORATING SAME

This nonprovisional application claims priority under 35 U.S.C. §119(a) on Patent Application No. 2008-003701 filed in Japan on Jan. 10, 2008, and Patent Application No. 2008-003704 filed in Japan on Jan. 10, 2008, the entire contents of which are hereby incorporated by reference.

FIELD OF THE INVENTION

The present invention relates to solid image capture devices and electronic devices incorporating such a device, more specifically to solid image capture devices suitably used in, for example, camera-equipped mobile phones, digital still cameras, surveillance cameras, security cameras for the door phone system, and various other electronics.

BACKGROUND OF THE INVENTION

The mounting (soldering) of components for an electronic device incorporating a solid image capture device is generally performed by surface mount soldering in a reflow oven to achieve high packaging density and small step counts. The components, together with a printed board carrying them, are all put in a reflow oven for heating. Therefore, the method enables large numbers of components to be soldered to a printed board with high density in a single step.

In contrast, a solid image capture element is mounted to a printed board (wiring board) inside an image capture device (digital still camera, video camera, surveillance camera, etc.) after the solid image capture element is sealed temporarily in a resin package.

The solid image capture element can be mounted inside the image capture device by soldering, with a socket, or using a flexible board bridging the element to the device, to name a few major exemplary methods.

The soldering involves an issue of thermal resistance of the solid image capture element. The use of a socket leads to problems such as irregular resin molding and positioning error due to thermal expansion. The use of a flexible board also entails problems: printed lines may break under large bending force while the flexible board is being attached or solder may crack on the flexible board under the pressure applied to the solder.

The socket method is often employed when reduction of cost (number of steps required) is a primary concern because the method allows the socket to be mounted in a reflow oven.

Patent documents 1 to 3 exemplify solid image capture devices mounted to an image capture device.

FIG. 31 is a cross-sectional view of a solid image capture device described in patent document 1. A solid image capture device 200, as disclosed in patent document 1, contains a wiring board 201 and a solid image capture element 202 which is electrically connected to the board 201 via the wire bonds formed by metal elements 203.

FIG. 32 is a cross-sectional view of a solid image capture device described in patent document 2. A solid image capture device 300, as disclosed in patent document 2, contains a wiring board 301 and a solid image capture element 302 which is electrically connected to the board 301 via solder electrodes (not shown) provided on the back of the solid image capture element 302 (opposite to the light receiving surface of the solid image capture element 302).

FIG. 33 is a plan and a cross-sectional view of a solid image capture element in a solid image capture device described in patent document 3. A solid image capture device 400, as disclosed in patent document 3, contains a solid image capture element 402 having an effective pixel area 403 covered with a transparent member 404. The light receiving surface on which the effective pixel area 403 is formed has bonding pads 405. The solid image capture element 402 is electrically connected to a wiring board (not shown) via wire bonding formed between the bonding pads 405 and terminals on the wiring board. Patent document 3 also describes that these solid image capture elements 402 are produced by dicing a semiconductor wafer to which a glass sheet is attached.

In conventional solid image capture devices, the solid image capture element is difficult to remove from the wiring board and place precisely on the wiring board because the solid image capture element needs to be adhered or compressed to the wiring board. Conventional solid image capture devices also require a complex manufacturing process for the same reason.

Specifically, in patent document 1, the solid image capture element 202 is adhered to an element connecting plate 204 interposed between the wiring board 201 and the solid image capture element 202. The wiring board 201 and the solid image capture element 202 are wire bonded by the metal elements 203. It is therefore very difficult to remove the solid image capture element 202 from the wiring board 201.

Furthermore, in the solid image capture device 200, the element connecting plate 204 to which the solid image capture element 202 is adhered is fixed to a lens enclosure 205 by screws (not shown). An elastic body (filter holding member 206) holds down the solid image capture element 202 and a lowpass filter 207 upon the fixing. The solid image capture element 202 could be displaced on the wiring board 201 depending on how tightly the plate 204 is screwed to the enclosure 205. A protection glass 208, as well as the lowpass filter 207, is also needed to protect the solid image capture element 202 because the filter holding member 206 is holding down the solid image capture element 202.

Patent document 2 is utterly silent about how to form the solder electrodes on the back of the solid image capture element 302. These solder electrodes can only provided by means of either electrodes extending through the solid image capture element 302 ("through silicon vias" or TSVs) or wires disposed on a side face of the solid image capture element 302. However, many highly complex steps are additionally needed to form the solder electrodes on the back of the solid image capture element 302. The additional steps reduce production efficiency and increase production cost.

Patent document 3 requires the wire bonding between the bonding pads 405 on the light receiving surface of the solid image capture element 402 and the terminals on the wiring board. Patent document 3 further requires the solid image capture element 402, including the bonding wires, being packaged on the wiring board, so that the solid image capture element 402 can be placed precisely on the wiring board and mounted to the image capture device. The structure makes it very difficult to remove the solid image capture element 402 from the wiring board.

Patent Document 1: Japanese Unexamined Patent Publication No. 2001-21976 (Tokukai 2001-21976; published Jan. 26, 2001)

Patent Document 2: Japanese Unexamined Patent Publication No. 2003-319217 (Tokukai 2003-319217; published Nov. 7, 2003)

Patent Document 3: Japanese Unexamined Patent Publication No. 2004-296453 (Tokukai 2004-296453; published Oct. 21, 2004)

SUMMARY OF THE INVENTION

The present invention, conceived in view of the problems detailed above, has an objective of providing a solid image capture device which allows a solid image capture element to be attached to and detached from a wiring board and the solid image capture element to be readily placed precisely on the wiring board and also providing an electronic device incorporating the solid image capture device.

A solid image capture device in accordance with the present invention is, to achieve the objective, characterized by including: a solid image capture element; a wiring board to which the solid image capture element is mounted, the wiring board including wiring for electrical connection with the solid image capture element; a transparent lid section provided over the solid image capture element to cover a light receiving section of the solid image capture element with a gap being left between the transparent lid section and the light receiving section; and a holder provided on the wiring board to encase therein the solid image capture element, wherein the holder is detachably fixed to the wiring board and applies pressure to the transparent lid section when the holder is fixed to the wiring board.

According to this aspect of the invention, the holder applies pressure to the transparent lid section in a state in which the holder is fixed to the wiring board. The fixing of the holder to the wiring board and the pressure applied by the holder to the transparent lid section fix the solid image capture element onto the wiring board. The mechanism does not require conventional adhesion by means of an adhesive or compression under physical pressure in mounting the solid image capture element onto the wiring board. Furthermore, the holder is detachable from the wiring board. Should the wiring board or the solid image capture element malfunction, it can be readily replaced.

The fixing of the holder to the wiring board and the pressure applied by the holder to the transparent lid section enables positioning of the holder on the wiring board. That in turn enables positioning on the wiring board of the holder encasing the solid image capture element therein.

As detailed above, the invention allows attaching/detaching of the solid image capture element to/from the wiring board, which in turn enables easy positioning of the solid image capture element on the wiring board.

Another solid image capture device in accordance with the present invention is, to achieve the objective, characterized by including: a solid image capture element; a wiring board to which the solid image capture element is mounted, the wiring board including wiring for electrical connection with the solid image capture element; a transparent lid section provided over the solid image capture element to cover a light receiving section of the solid image capture element with a gap being left between the transparent lid section and the light receiving section; and a holder provided on the wiring board to encase therein the solid image capture element, wherein the holder is detachably fixed to the wiring board and applies pressure to side faces of the transparent lid section in a direction normal to the faces, to nip and secure the transparent lid section.

According to this aspect of the invention, the holder secures the side faces of the transparent lid section in a state in which the holder is fixed to the wiring board. Furthermore, the holder presses the transparent lid section in a direction normal to the side faces of the transparent lid section. The fixing of the holder to the wiring board and the squeezing force exerted by the holder to the transparent lid section fix the solid image capture element onto the wiring board. The mechanism does not require conventional adhesion by means of an adhesive or compression under physical pressure in mounting the solid image capture element onto the wiring board. Furthermore, the holder is detachable from the wiring board. Should the wiring board or the solid image capture element malfunction, it can be readily replaced.

The fixing of the holder to the wiring board and the securing by the holder of the transparent lid section on the side faces thereof enables positioning of the holder on the wiring board. That in turn enables positioning on the wiring board of the holder encasing the solid image capture element therein.

As detailed above, the invention allows attaching/detaching of the solid image capture element to/from the wiring board, which in turn enables easy positioning of the solid image capture element on the wiring board.

The holder squeezes the transparent lid section on its side faces. The structure does not intercept the optical path from the front face (top face) of the transparent lid section to the light receiving section of the solid image capture element.

Another solid image capture device in accordance with the present invention is, to achieve the objective, characterized by including: a solid image capture element; a wiring board to which the solid image capture element is mounted, the wiring board including wiring for electrical connection with the solid image capture element; a transparent lid section provided over the solid image capture element to cover a light receiving section of the solid image capture element with a gap being left between the transparent lid section and the light receiving section; and a holder provided on the wiring board to encase therein the solid image capture element except for the light receiving section, wherein the holder is anchored to the wiring board to hold down the transparent lid section in a direction normal to a light receiving surface of the solid image capture element toward the solid image capture element.

According to this aspect of the invention, the holder is fixed to the wiring board by anchoring to the wiring board. Furthermore, in this anchored state, the holder presses the transparent lid section in a direction normal to the light receiving surface of the solid image capture element. The anchoring of the holder to the wiring board and the squeezing force exerted by the holder fix the solid image capture element onto the wiring board. The mechanism does not require conventional adhesion by means of an adhesive or compression under physical pressure in mounting the solid image capture element onto the wiring board. Furthermore, the holder is anchored to the wiring board, but detachable from it. Should the wiring board or the solid image capture element malfunction, it can be readily replaced.

The anchoring of the holder to the wiring board enables positioning of the holder on the wiring board. That in turn enables positioning on the wiring board of the holder encasing the solid image capture element therein.

As detailed above, the invention allows attaching/detaching of the solid image capture element to/from the wiring board, which in turn enables easy positioning of the solid image capture element on the wiring board.

The holder houses the solid image capture element, but the light receiving section is left uncovered. The structure does not intercept the optical path to the light receiving section.

Additional objectives, advantages and novel features of the invention will be set forth in part in the description which follows, and in part will become apparent to those skilled in the art upon examination of the following or may be learned by practice of the invention.

DESCRIPTION OF THE EMBODIMENTS

Embodiment 1

Figure 1:
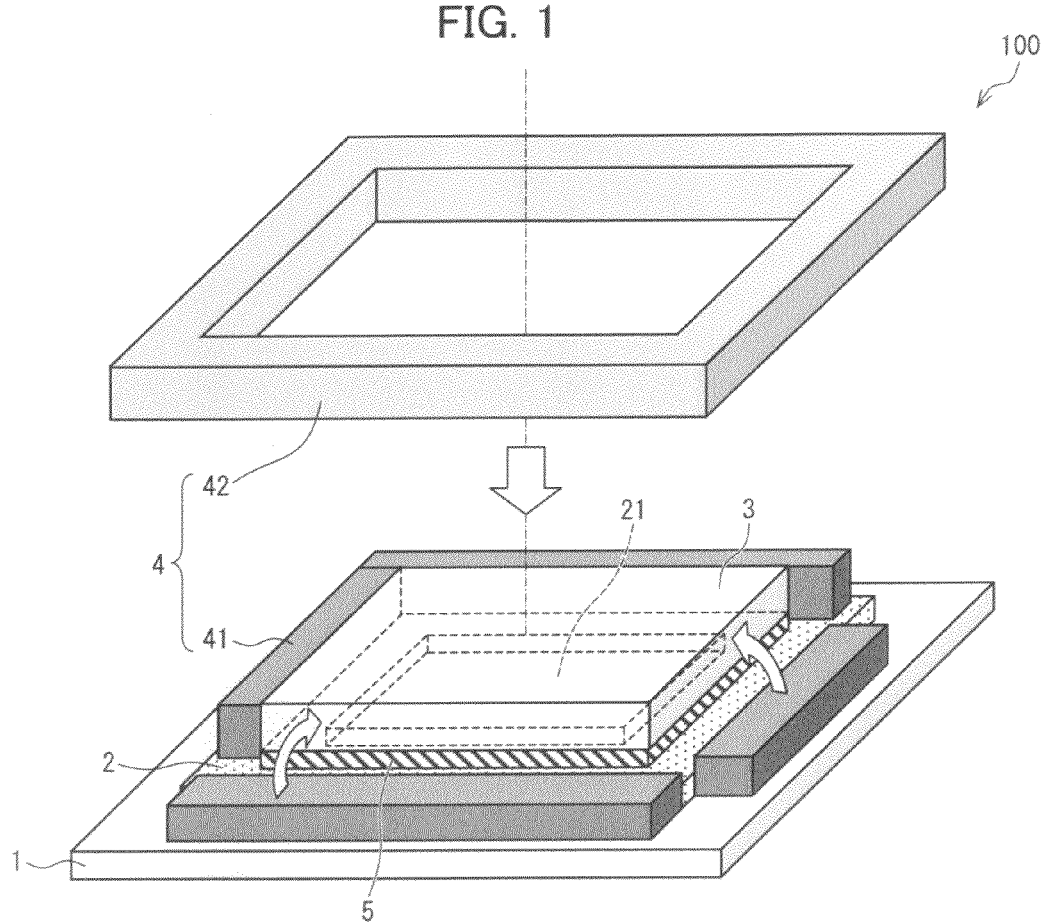
FIG. 1 is an exploded oblique view of a solid image capture device in accordance with the present invention, schematically depicting its structure.
Figure 2:
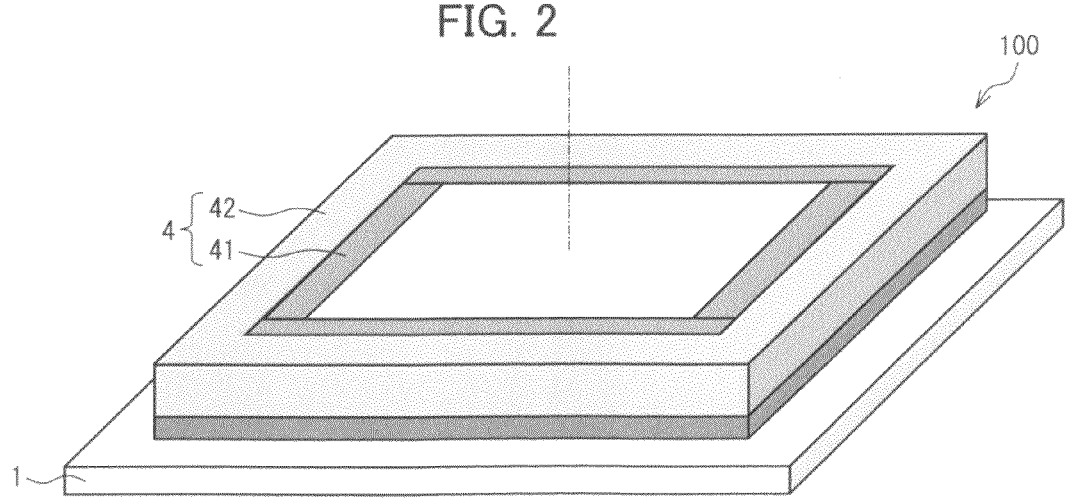
FIG. 2 is an oblique view of a solid image capture device in accordance with the present invention.

The following will describe an embodiment of the present invention in reference to FIGS. 1 to 12. FIG. 1 is an exploded oblique view of a solid image capture device in accordance with the present invention, schematically depicting its structure. FIG. 2 is an oblique view of a solid image capture device in accordance with the present invention.

Referring to FIG. 1, a solid image capture device 100 contains a wiring board 1, a solid image capture element 2, a transparent lid section 3, and a holder 4. Referring next to FIG. 2, the solid image capture device 100 is adapted so that the solid image capture element 2 is encased in the holder 4. The top face of the transparent lid section 3 is not covered with the holder 4. Assume, for ease in description, that the wiring board 1 side of the device 100 (moving toward the wiring board 1) is the "down" or "bottom" side and that the transparent lid section 3 side (moving away from the wiring board 1) is the "up" or "top" side.

Specifically, the wiring board 1 provides an output path for electrical signals from the solid image capture element 2. The wiring board 1 is a substrate which has patterned wiring (not shown) formed thereon to electrically connect the board 1 to the solid image capture element 2. The electrical signal outputs from the solid image capture element 2 travel via the holder 4 to the wiring board 1. Details will be given later. The wiring board 1 may be, for example, a printed board or a ceramic board. Electrodes for external connection (not shown) are provided on the back of the wiring board 1.

The solid image capture element 2 sits at the center of the wiring board 1. The element 2 is a semiconductor substrate (e.g., a monocrystal silicon substrate) having formed thereon a semiconductor circuit and appears rectangular when viewed from above. The solid image capture element 2 may be, to name a few examples, a CCD (charge-coupled device) image sensor, a CMOS (complementary metal-oxide semiconductor) image sensor, or a VMIS (threshold voltage modulation image sensor). The solid image capture element 2 has a light receiving section 21 containing an array of light receiving elements (pixels). The light receiving section 21 forms the effective pixel area (image capturing plane) for the solid image capture element 2. The light receiving section 21, being rectangular when viewed from above, sits at the center of the primary face (front face) of the solid image capture element 2. The light receiving elements convert an image of an object formed on the light receiving section 21 (light passing through the transparent lid section 3) into electrical signals. The solid image capture element 2 is mounted to the wiring board 1 without resorting to adhesion (for example, by using an adhesive) or compression (under physical pressure). Details will be given later.

Figure 3:
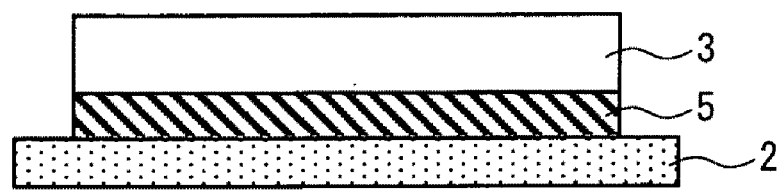
FIG. 3 is a side view of a solid image capture element and a transparent lid section of the solid image capture device shown in FIG. 1.
Figure 4:
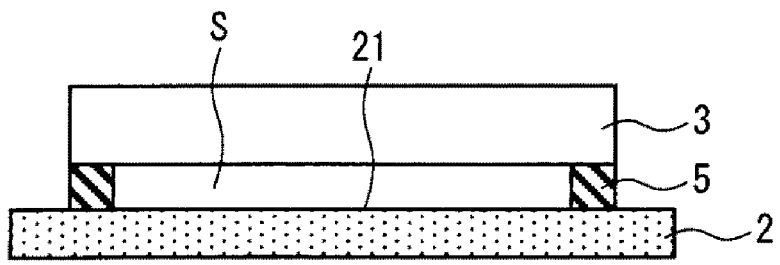
FIG. 4 is a cross-sectional view of the solid image capture element and the transparent lid section in the solid image capture device shown in FIG. 1.

The transparent lid section 3 is provided on that side face of the solid image capture element 2 on which the light receiving section 21 is formed, so as to face the light receiving section 21. In other words, the transparent lid section 3 is provided so as to cover the light receiving section 21. FIG. 3 is a side view of the solid image capture element 2 and the transparent lid section 3 in the solid image capture device 100. FIG. 4 is a cross-sectional view of the element 2 and the section 3. As shown in FIGS. 3 and 4, the transparent lid section 3 is adhered onto the solid image capture element 2 by an adhesive section 5 disposed around the light receiving section 21. The transparent lid section 3 is positioned to leave a gap S between the section 3 and the light receiving section 21. The gap S is sealed because the adhesive section 5 is disposed all around the light receiving section 21. The sealing of the gap S prevents moisture from entering the light receiving section 21 and dust from entering and sticking to the light receiving section 21. The sealing thus prevents the light receiving section 21 from developing defects. The transparent lid section 3 is made of transparent glass, transparent resin, or a like transparent material. The transparent lid section 3 may have an infrared blocking filter or like optical filter which blocks infrared light incident to the solid image capture element 2. The filter provides the transparent lid section 3 with a shielding capability from external infrared light.

The adhesive section 5 is formed by, for example, attaching a sheet of adhesive and patterning the adhesive through exposure and development using photolithography technology. The use of photolithography enables high precision patterning of the adhesive section 5. The use of the sheet of adhesive gives uniform thickness to the adhesive section 5. The transparent lid section 3 is thus adhered to the light receiving section 21 with high precision.

The holder 4 is detachably fixed to the wiring board 1. The holder 4 encases the solid image capture element 2 therein. Furthermore, the holder 4 applies pressure onto the side faces of the transparent lid section 3 in a direction normal to the faces, to squeeze the transparent lid section 3. In other words, the holder 4 holds the transparent lid section 3 perpendicular to the optical axis indicated by a dash-dot line in FIG. 1. The holder 4 also contains conductive wires (not shown) to provide electrical paths between the wiring board 1 and the solid image capture element 2. Details will be given later about how the holder 4 squeezes the transparent lid section 3 on its side faces to secure the section 3.

The holder 4 is fixed to the wiring board 1 when the holder 4 comes into contact with the side faces of the transparent lid section 3. This mechanism enables positioning of the holder 4 relative to the transparent lid section 3. That in turn enables positioning of the solid image capture element 2 on the wiring board 1. The holder 4 squeezes the transparent lid section 3 on its side faces, leaving the front face (top face) of the transparent lid section 3 uncovered with the holder 4. The structure does not intercept the optical path up to the light receiving section 21 of the solid image capture element 2. The holder 4 is provided on the wiring board 1, skirting around the optical path up to the light receiving section 21 of the solid image capture element 2, so as to encase therein the solid image capture element 2 and the transparent lid section 3.

Various electronic components (not shown) may be mounted on the wiring board 1 to drive the solid image capture device 100. An example of such an electronic component is a signal processing circuit which processes signals for the solid image capture element 2. Specifically, the signal processing circuit functions as a control section (image processing device) which controls operation of the solid image capture element 2 and suitably processes signal outputs of the solid image capture element 2 to produce necessary signals. The signal processing circuit may contain various electronic components: for example, an amplifier circuit section (analog signal circuit section) amplifying electrical signals obtained by conversion by the light receiving elements in the light receiving section 21 to output the amplified electrical signals as analog signals, an A/D conversion circuit section converting the analog signals to digital signals, a DSP (digital signal processor) controlling operation of the solid image capture element 2, a CPU executing various computation according to computer programs, a ROM containing the computer programs, and a RAM storing data for the various processes. Other examples of the electronic components include resistors and capacitors.

The solid image capture device 100 allows the external light picked up by a lens (not shown) to reach the inside of the solid image capture element 2 via the transparent lid section 3 so that the light forms an image on the light receiving elements in the light receiving section 21 of the solid image capture element 2. The solid image capture device 100 contains an empty space between the light receiving section 21 and the transparent lid section 3. Therefore, the light, after passing through the transparent lid section 3, hits the light receiving section 21 without experiencing any interruption. No part of the light is lost along that particular segment of the optical path.

As detailed above, the holder 4 is fixed to the wiring board 1 in the solid image capture device 100 when the holder 4 nips the transparent lid section 3 on its side faces. Besides, the holder 4 presses the transparent lid section 3 in a direction normal to the side faces of the transparent lid section 3. The fixing of the holder 4 to the wiring board 1 and the squeezing force exerted by the holder 4 to the transparent lid section 3 fix the solid image capture element 2 to the wiring board 1. Hence, the embodiment does not require conventional adhesion (for example, by using an adhesive) or compression (under physical pressure) in mounting the solid image capture element 2 to the wiring board 1. Also, the holder 4 is detachable from the wiring board 1 (and re-attachable to the board 1). Should the wiring board 1 or the solid image capture element 2 malfunction, it can be readily replaced.

The holder 4 can be placed precisely on the wiring board 1 because the holder 4 is fixed to the wiring board 1 and nips the transparent lid section 3 on its side faces. This structure enables the solid image capture element 2 disposed inside the holder 4 to be placed precisely on the wiring board 1.

In the solid image capture device 100 according to the present embodiment as detailed above, the solid image capture element 2 can be fixed onto the wiring board 1 without involving adhesion or compression, and the solid image capture element 2 can be placed precisely on the wiring board 1.

Figure 5:
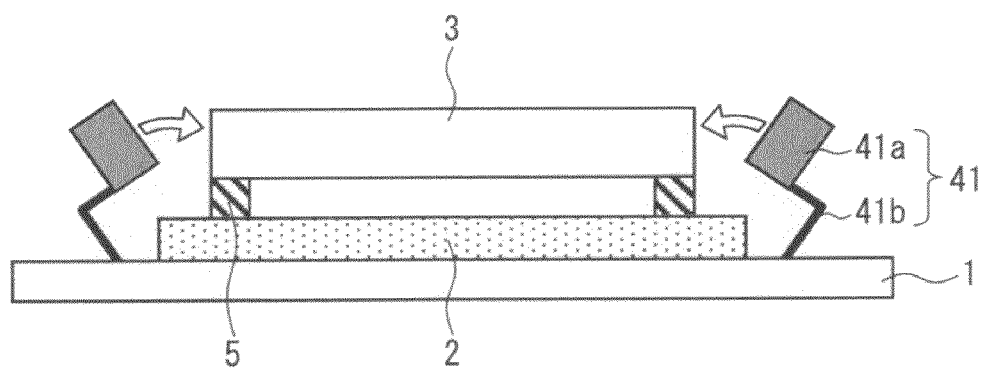
FIG. 5 is a cross-sectional view illustrating how a holder nips and holds the transparent lid section in the solid image capture device shown in FIG. 1.
Figure 5:
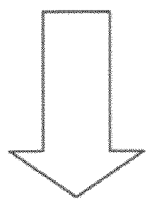
Figure 5:
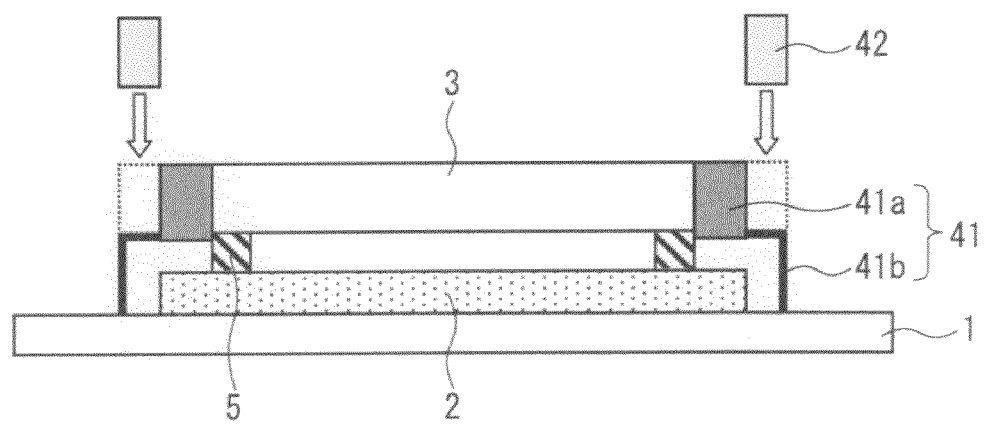

Details are now given about how the holder 4 nips across the transparent lid section 3, in reference to FIGS. 1 and 5. Referring to FIG. 1, the holder 4 contains lock tabs 41 locking the transparent lid section 3 and a frame 42 securing the lock tabs 41. Each lock tab 41 is physically separated from the others so that it can lock a different one of the side faces of the transparent lid section 3 in the solid image capture device 100. In other words, a lock tab 41 is provided on each of the four sides of the square transparent lid section 3 as shown in FIG. 1. The lock tabs 41 come into contact with the respective side faces of the transparent lid section 3. The frame 42 is formed to fit the outer faces of the lock tabs 41 on all the four sides when moved into place.

A more concrete description is given. FIG. 5 is a cross-sectional view illustrating how the holder 4 nips and holds the transparent lid section 3 on its side faces. As shown in FIG. 5, each lock tab 41 is provided, separately from the others, for a different one of the side faces of the transparent lid section 3. Each lock tab 41 has a contact section 41a which contacts one of the side faces and a lock section 41b pivotally supporting the contact section 41a. The lock section 41b is detachably fixed to the wiring board 1 by, for example, inserting it into a hole (not shown) in the wiring board 1.

The contact sections 41a normally exert pressure in directions indicated by arrows in FIG. 5 (toward the transparent lid section 3) to secure the transparent lid section 3 on its sides. The lock sections 41b are however pliable and allow the contact sections 41a to rotate and move in directions opposite to those indicated by the arrows in FIG. 5 (away from the transparent lid section 3).

In this structure, the contact sections 41a are moved to create a greater opening than the solid image capture element 2 when mounting the solid image capture element 2 to the wiring board 1. After the mounting, the opening separating the contact sections 41a is reduced in size to less than the solid image capture element 2 so that the contact sections 41a come into contact with the side faces of the transparent lid section 3. The mechanism facilitates the mounting of the solid image capture element 2 to the wiring board 1. After securing the transparent lid section 3 with the contact sections 41a, the frame 42 is positioned in place around the contact sections 41a. The frame 42 prevents rotation of the contact sections 41a.

Figure 6:
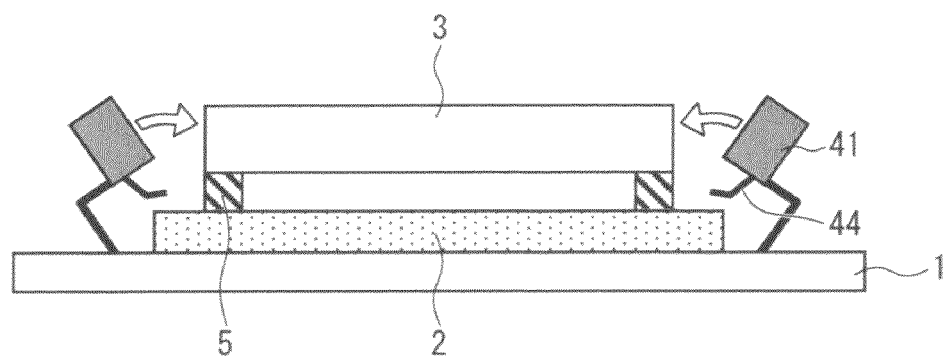
FIG. 6 is a cross-sectional view of exemplary electrical connection between the solid image capture element and the holder in the solid image capture device shown in FIG. 1.
Figure 6:
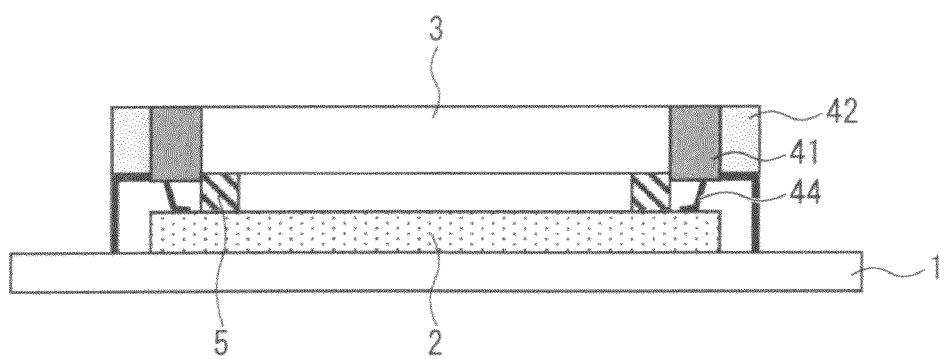
Figure 7:
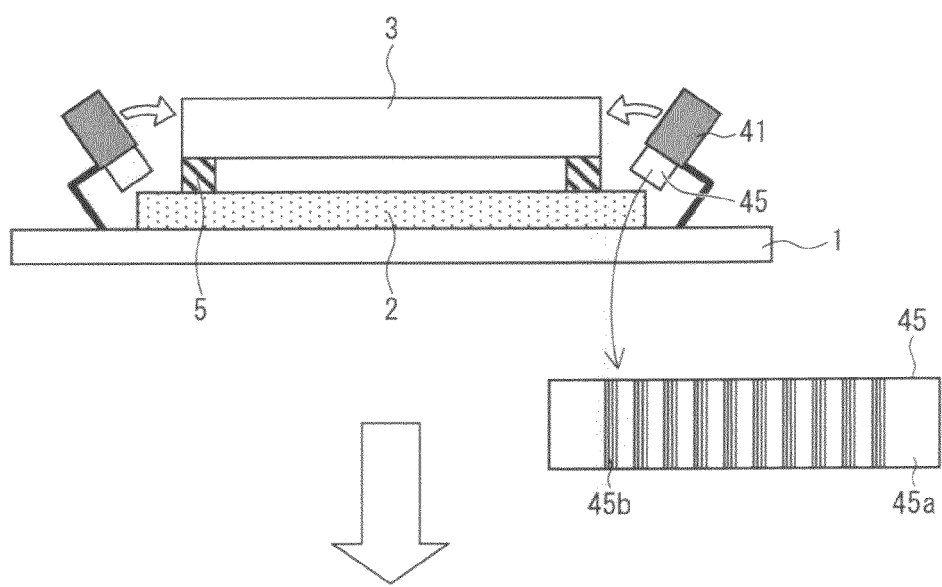
FIG. 7 is a cross-sectional view of exemplary electrical connection between the solid image capture element and the holder in the solid image capture device shown in FIG. 1.
Figure 7:
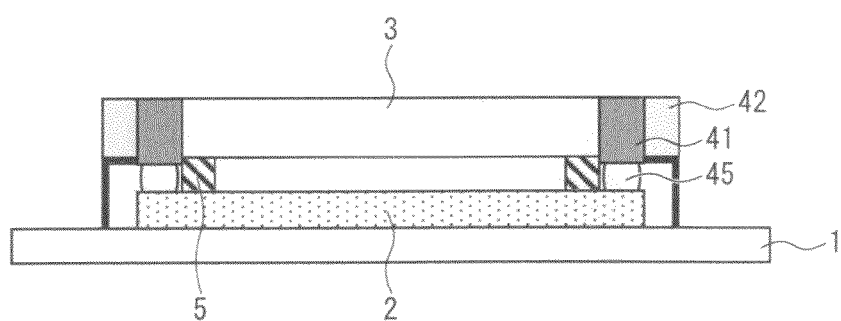
Figure 8:
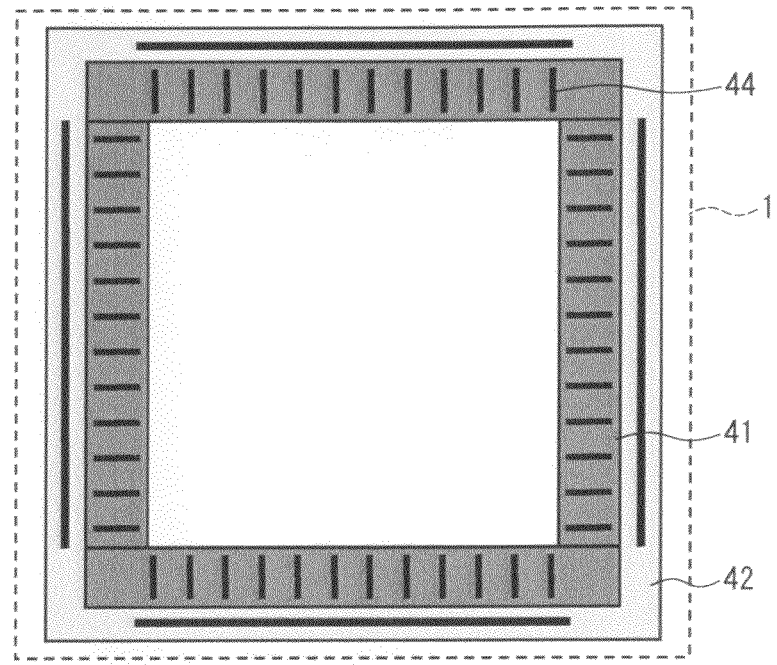
FIG. 8 is a back view of lock tabs and a frame in the solid image capture device shown in FIG. 6.
Figure 9:
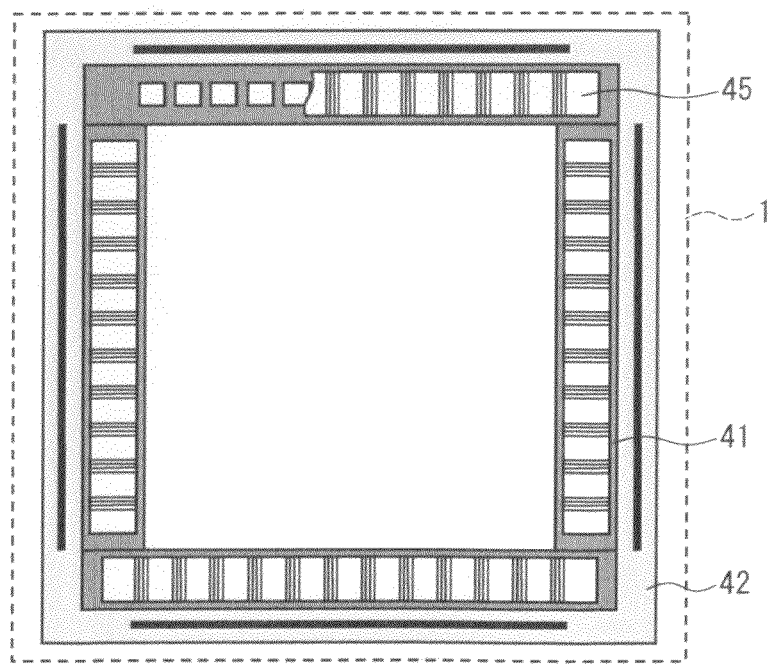
FIG. 9 is a back view of lock tabs and a frame in the solid image capture device shown in FIG. 7.

Next will be described electrical connection between the wiring board 1 and the solid image capture element 2 in the solid image capture device 100. Three solid image capture device 100 is not limited in any particular manner in terms of how electrical signals should be taken out from the solid image capture element 2 and fed to the wiring board 1. For example, electrical signals from the solid image capture element 2 may be passed directly to the wiring board 1 or routed via the holder 4 before being fed to the wiring board 1. FIGS. 6 to 7 are cross-sectional views of exemplary electrical connection between the solid image capture element 2 and the holder 4. FIG. 8 is a back view of the lock tabs 41 and the frame 42 in the arrangement shown in FIG. 6. FIG. 9 is a back view of the lock tabs 41 and the frame 42 in the arrangement shown in FIG. 7. Either one of the holder 4 and the solid image capture element 2, in these arrangements, is provided with a connecting section electrically connecting the holder 4 and the solid image capture element 2. The connecting section is adapted to come into contact with the holder 4 and the solid image capture element 2 when the transparent lid section 3 is nipped firmly by the holder 4. The structure enables transmission of electrical signals from the solid image capture element 2 to the wiring board 1 via the connecting section.

A more concrete description is given. FIGS. 6 and 8 depict an example in which probe pin terminals 44 are used as the connecting section. The probe pin terminals 44 are formed on the back of the lock tabs 41 in FIG. 6. The probe pin terminals 44 are provided covering substantially the entire back of the lock tabs 41 as shown in FIG. 8 and come into contact with electrode terminals (not shown) formed on the solid image capture element 2 when the transparent lid section 3 is nipped firmly by the holder 4 as shown in FIG. 6. The structure enables transmission of electrical signals from the solid image capture element 2 to the wiring board 1 via the probe pin terminals 44.

The use of the probe pin terminals 44 results in pressure building up on the tips of the probe pins. The pressure works in favor of setting up contacts between the probe pin terminals 44 and the electrode terminals (pad terminals) formed on the solid image capture element 2. Apart from that, the tips of the probe pin terminals 44 scratch the electrode terminals on the solid image capture element 2 upon setting up the contacts, scraping oxidation and various dirt off the surface of the electrode terminals on the solid image capture element 2. The scraping maintains the contacts between the probe pin terminals 44 and the electrode terminals on the solid image capture element 2 in good condition. Reliable contacts are thus established between the solid image capture element 2 and the wiring board 1 via the probe pin terminals 44.

FIGS. 7 and 9 depict an example in which electrically conductive rubber 45 is used as the connecting section. The electrically conductive rubber 45 is provided on the back of the lock tabs 41 in FIG. 7. The electrically conductive rubber 45 is provided covering substantially the entire back of the lock tabs 41 as shown in FIG. 8 and is composed of a resin section 45a made of rubber (elastomer) and conduction sections 45b made of multiple copper lines as schematically shown in FIG. 7. The conduction sections 45b are adapted to conduct only in the vertical direction. The structure enables transmission of electrical signals from the solid image capture element 2 to the wiring board 1 via the electrically conductive rubber 45. The inclusion of the copper lines in the conduction sections 45b enables conduction between the solid image capture element 2 and the holder 4 without having to dispose the electrically conductive rubber 45 strictly in alignment with terminals (not shown) formed for electrical connection between the solid image capture element 2 and the holder 4. The electrically conductive rubber 45, being elastic, acts as a cushion when the transparent lid section 3 is held down.

Figure 10:
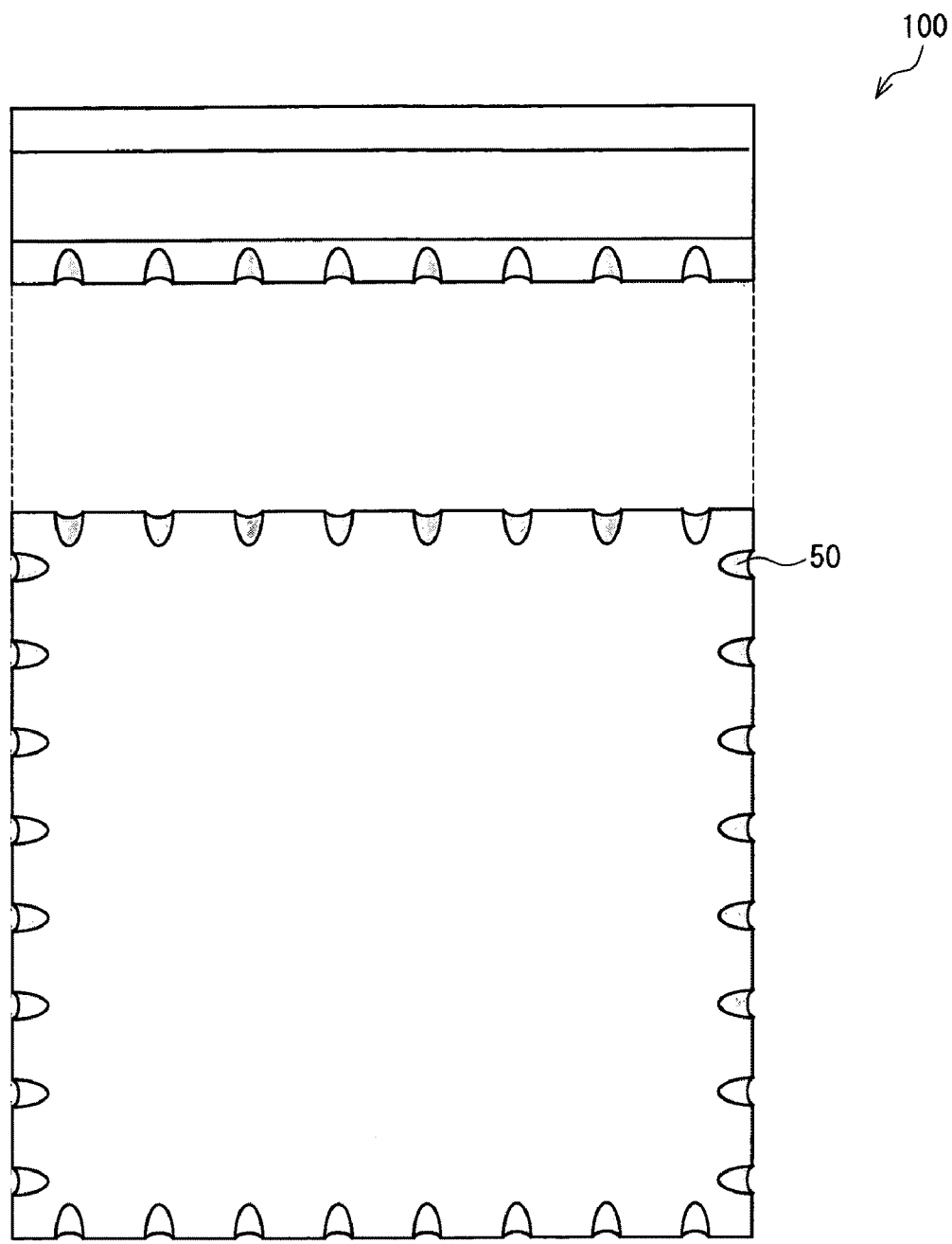
FIG. 10 is a side view and a back view of a LCC solid image capture device.
Figure 11:
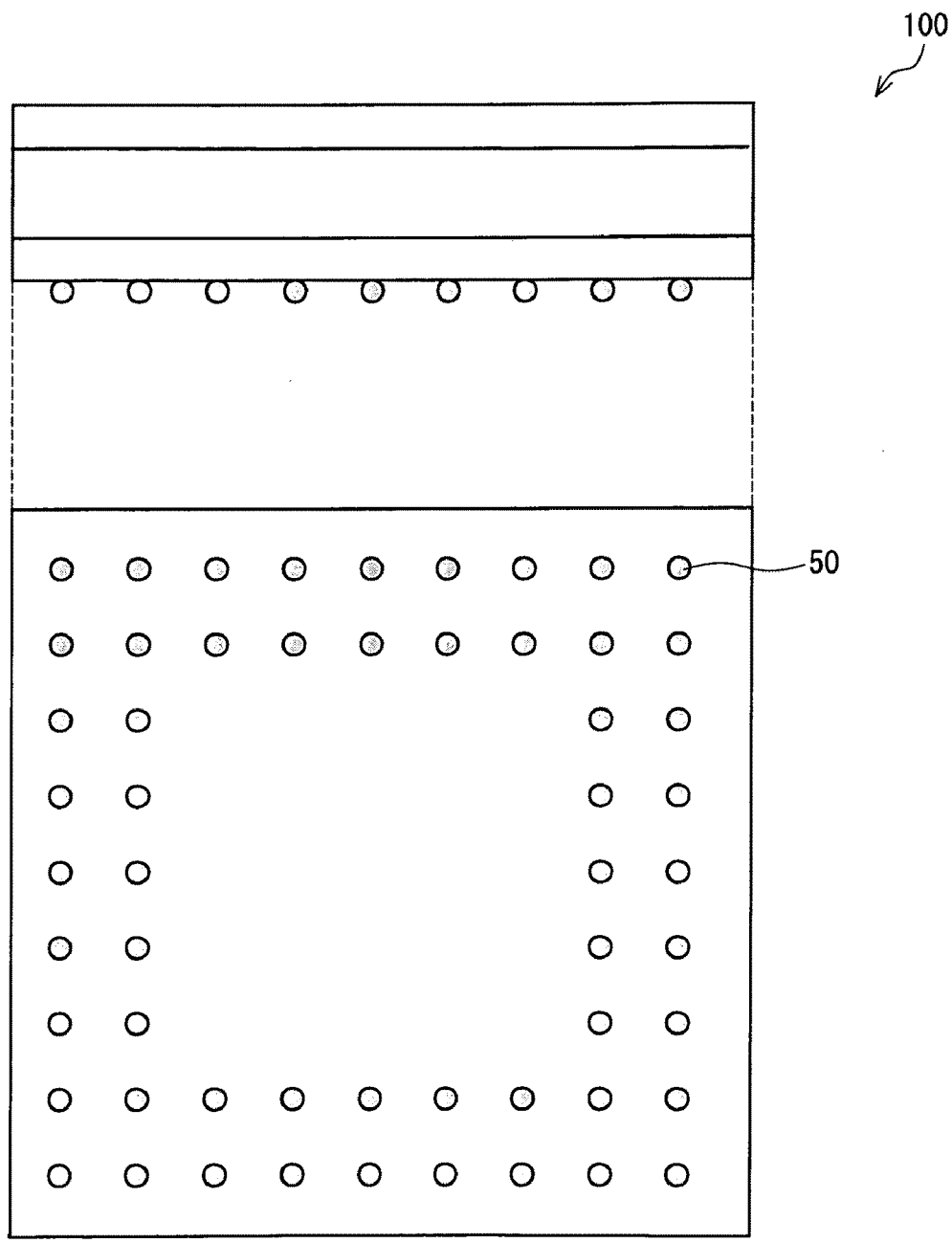
FIG. 11 is a side view and a back view of a BGA solid image capture device.

The solid image capture device 100, arranged as above, may have, for example, a LCC-like structure shown in FIG. 10 or a BGA-like structure shown in FIG. 11. FIGS. 10 and 11 are a back view and a side view of these structures. In either case, the device 100 is soldered to a substrate of various image capture devices (electronic devices) via terminals 50 provided on the back of the device 100.

Figure 12:
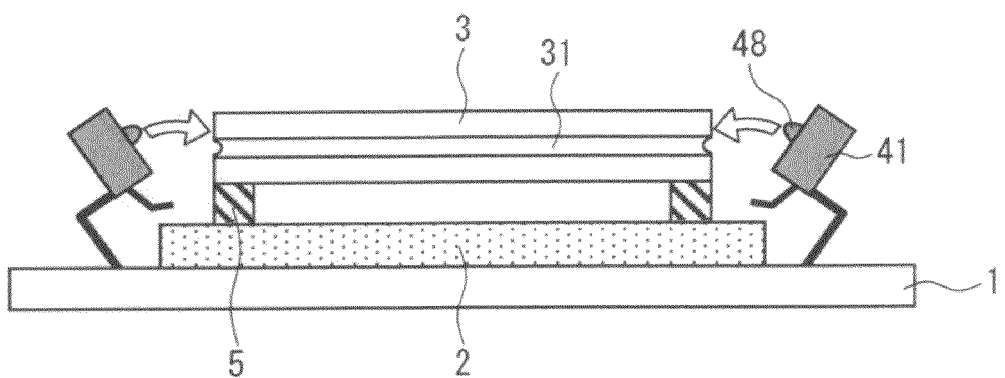
FIG. 12 is a cross-sectional view of exemplary electrical connection between a wiring board and the holder in the solid image capture device shown in FIG. 1.
Figure 12:
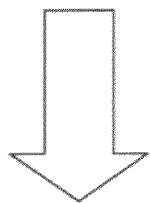
Figure 12:
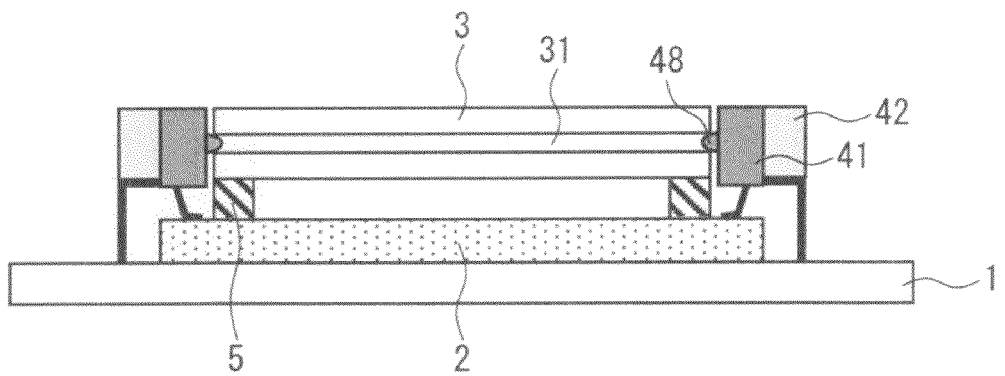

In the present embodiment, the side faces of the transparent lid section 3 have been assumed to be flat. Alternatively, the side faces of the transparent lid section 3 may have a groove 31 as shown in FIG. 12, and the holder 4 may have projections 48 which fit in the groove 31 when the holder 4 nips the transparent lid section 3. The mechanism enables high precision placement of the holder 4 and the solid image capture element 2 on the wiring board 1.

As described in the foregoing, the solid image capture device in accordance with the present invention includes, on a wiring board, a holder in which a solid image capture element is encased. The holder is detachably fixed to the wiring board and applies pressure to the side faces of a transparent lid section in a direction normal to the faces to nip and secure the transparent lid section. These features advantageously allow attaching/detaching of the solid image capture element to/from the wiring board, which in turn enables easy positioning of the solid image capture element on the wiring board.

In the solid image capture device in accordance with the present invention, the holder may include: contact sections each provided for a different one of the side faces of the transparent lid section to contact that side face; lock sections pivotally supporting the contact sections and detachably fixed to the wiring board; and a frame securing the contact sections when fit around the contact sections.

According to this aspect of the invention, the contact sections each provided for a different one of the side faces of the transparent lid section are pivotally supported by the lock sections. The contact sections are moved to create a greater opening than the solid image capture element. After mounting the solid image capture element to the wiring board, the opening separating the contact sections is reduced in size to less than the solid image capture element so that the contact sections come into contact with the side faces of the transparent lid section. The mechanism facilitates the mounting of the solid image capture element to the wiring board.

The solid image capture device in accordance with the present invention is preferably adapted so that: either the holder or the solid image capture element has a connecting section for electrical connection between the holder and the solid image capture element; and the connecting section comes into contact with the holder and the solid image capture element when the transparent lid section is secured by the holder.

According to this aspect of the invention, a connecting section is provided which comes into contact with the holder and the solid image capture element in a state in which the transparent lid section is secured by the holder. The feature enables transmission of electrical signals from the solid image capture element to the wiring board via the connecting section when the holder is anchored to the wiring board.

In the solid image capture device in accordance with the present invention, the connecting section may be probe pin terminals. The anchoring of the holder to the wiring board enables transmission of electrical signals from the solid image capture element to the wiring board via the probe pin terminals.

In the solid image capture device in accordance with the present invention, the connecting section may be electrically conductive rubber. The anchoring of the holder to the wiring board enables transmission of electrical signals from the solid image capture element to the wiring board via the electrically conductive rubber.

The solid image capture device in accordance with the present invention may be adapted so that: the transparent lid section has a groove on its side faces; and the holder has projections which are anchored in the groove.

According to this aspect of the invention, the projections provided on the holder are anchored in the groove provided on the side faces of the transparent lid section in a state in which the transparent lid section is secured on its side faces by the holder. The structure enables high precision positioning of the holder and the solid image capture element on the wiring board.

The electronic device of the present invention contains any one of the foregoing solid image capture devices. The feature enables the solid image capture element to be attached to and detached from the wiring board. The resultant electronic device thus allows easy positioning of the solid image capture element on the wiring board.

Embodiment 2

Figure 13:
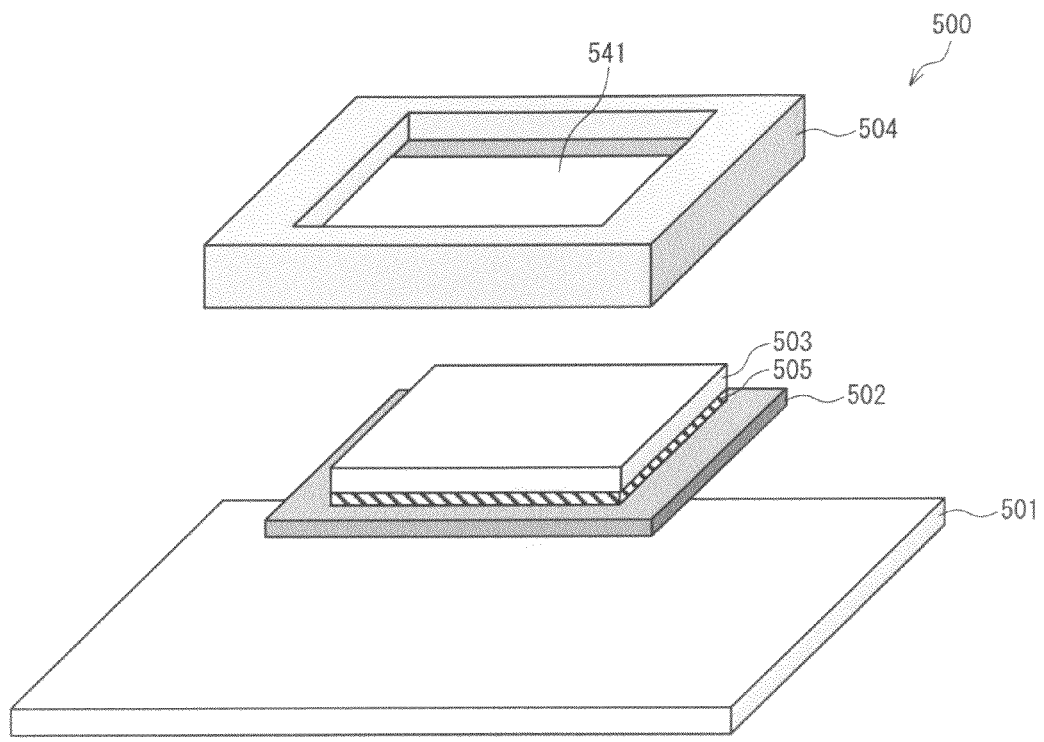
FIG. 13 is an exploded oblique view of a solid image capture device in accordance with the present invention, schematically depicting its structure.
Figure 14:
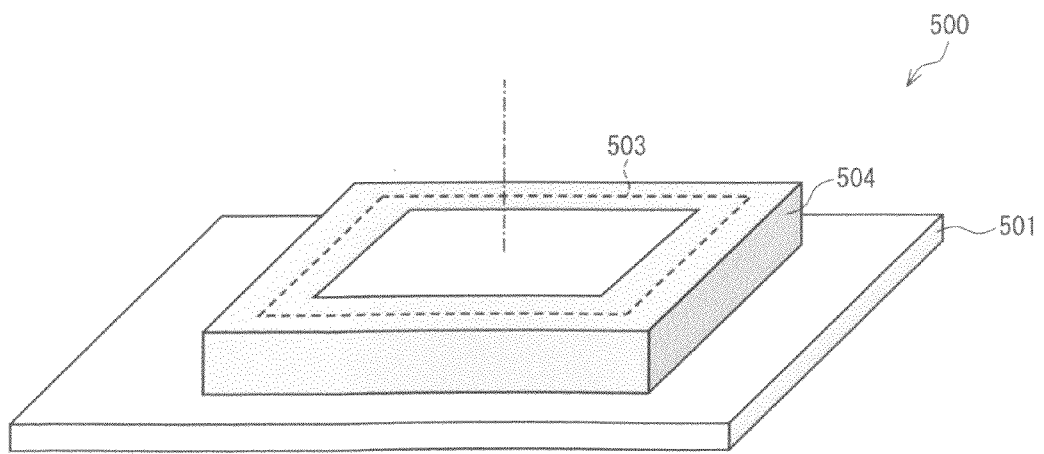
FIG. 14 is an oblique view of a solid image capture device in accordance with the present invention.

The following will describe another embodiment of the present invention in reference to FIGS. 13 to 30. FIG. 13 is an exploded oblique view of a solid image capture device in accordance with the present invention, schematically depicting its structure. FIG. 14 is an oblique view of a solid image capture device in accordance with the present invention.

Referring to FIG. 13, a solid image capture device 500 contains a wiring board 501, a solid image capture element 502, a holder 504, and a transparent lid section 503 which is disposed to face the solid image capture element 502. The solid image capture device 500, as shown in FIG. 14, is adapted so that the solid image capture element 502 is encased in the holder 504. A part of the transparent lid section 503 is exposed in an opening 541 through the holder 504. Assume, for ease in description, that the wiring board 501 side of the device 500 (moving toward the wiring board 501) is the "down" or "bottom" side and that the transparent lid section 503 side (moving away from the wiring board 501) is the "up" or "top" side.

Specifically, the wiring board 501 provides an output path for electrical signals from the solid image capture element 502. The wiring board 501 is a substrate which has patterned wiring (not shown) formed thereon to electrically connect the board 501 to the solid image capture element 502. The electrical signals from the solid image capture element 502 travel via the holder 504 to the wiring board 501. Details will be given later. The wiring board 501 may be, for example, a printed board or a ceramic board. Electrodes for external connection (not shown) are provided on the back of the wiring board 501.

The solid image capture element 502 sits at the center of the wiring board 501. The element 502 is a semiconductor substrate (e.g., a monocrystal silicon substrate) having formed thereon a semiconductor circuit and appears rectangular when viewed from above. The solid image capture element 502 may be, to name a few examples, a CCD (charge-coupled device) image sensor, a CMOS (complementary metal-oxide semiconductor) image sensor, or a VMIS (threshold voltage modulation image sensor). The solid image capture element 502 has a light receiving section (not shown) containing an array of light receiving elements (pixels). The light receiving section forms the effective pixel area (image capturing plane) for the solid image capture element 502. The light receiving section, being rectangular when viewed from above, sits at the center of the primary face (front face) of the solid image capture element 502. The light receiving elements convert an image of an object formed on the light receiving section (light passing through the transparent lid section 503) into electrical signals. The solid image capture element 502 is mounted to the wiring board 501 without resorting to adhesion (for example, by using an adhesive) or compression (under physical pressure). Details will be given later.

Figure 15:
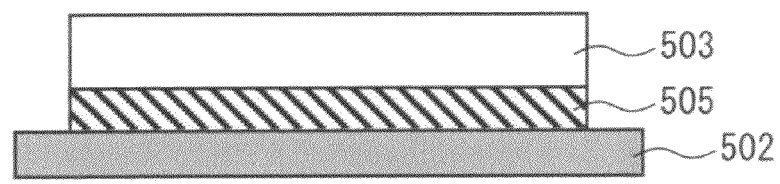
FIG. 15 is a side view of a solid image capture element and a transparent lid section in the solid image capture device shown in FIG. 13.
Figure 16:
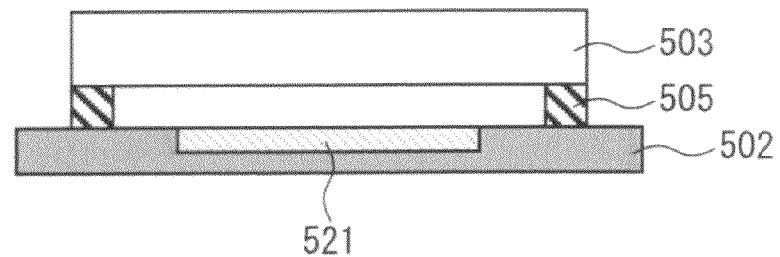
FIG. 16 is a cross-sectional view of the solid image capture element and the transparent lid section in the solid image capture device shown in FIG. 13.

The transparent lid section 503 is provided on that side face of the solid image capture element 502 on which the light receiving section is formed, so as to face the light receiving section. In other words, the transparent lid section 503 is provided so as to cover the light receiving section. FIG. 15 is a side view of the solid image capture element 502 and the transparent lid section 503 in the solid image capture device 500. FIG. 16 is a cross-sectional view of the element 502 and the section 503. As shown in FIGS. 15 and 16, the transparent lid section 503 is adhered to onto the solid image capture element 502 by an adhesive section 505 disposed around the light receiving section 521. The transparent lid section 503 is positioned to leave a gap S between the section 503 and the light receiving section 521. The gap S is sealed because the adhesive section 505 is disposed all around the light receiving section 521. The sealing of the gap S prevents moisture from entering the light receiving section 521 and dust from entering and sticking to the light receiving section 521. The sealing thus prevents the light receiving section 521 from developing defects. The transparent lid section 503 is made of transparent glass, transparent resin, or a like transparent material. The transparent lid section 503 may have an infrared blocking filter or like optical filter which blocks infrared light incident to the solid image capture element 502. The filter provides the transparent lid section 503 with a shielding capability from external infrared light.

The adhesive section 505 is formed by, for example, attaching a sheet of adhesive and patterning the adhesive through exposure and development using photolithography technology. The use of photolithography enables high precision patterning of the adhesive section 505. The use of the sheet of adhesive gives uniform thickness to the adhesive section 505. The transparent lid section 503 is thus adhered to the light receiving section 521 with high precision.

The holder 504 is anchored to the wiring board 501, housing the solid image capture element 502 therein. The holder 504 is provided with conductive wires (not shown), electrically connecting the wiring board 501 to the solid image capture element 502. The opening 541 is formed around the center of the top face of the holder 504. The size of the opening 541 is greater than the area of the light receiving section 521 of the solid image capture element 502 and smaller than the area of the top face (front face) of the transparent lid section 503. The structure allows the holder 504 to hold down the periphery of the transparent lid section 503. Put differently, the holder 504 holds down the top face of the transparent lid section 503 in a direction perpendicular to the light receiving section 521 (parallel to the optical axis indicated by dash-dot line in FIG. 13). The holder 504 pushes down the top face of the transparent lid section 503 as detailed above.

The holder 504 is anchored to the wiring board 501 when the holder 504 comes into contact with the periphery (the side faces and the edges of the front face) of the transparent lid section 503. Simultaneously, the light receiving section 521 of the solid image capture element 502 is placed inside the opening 541. This mechanism enables positioning of the holder 504 relative to the transparent lid section 503. That in turn enables positioning of the solid image capture element 502 on the wiring board 501. The light receiving section 521 of the solid image capture element 502 is disposed inside the opening 541. The structure does not intercept the optical path from the transparent lid section 503 to the light receiving section 521. The holder 504 is provided on the wiring board 501, skirting around the optical path up to the light receiving section 521 of the solid image capture element 502. The anchoring of the holder 504 to the wiring board 501 will be detailed later.

Various electronic components (not shown) may be mounted on the wiring board 501 to drive the solid image capture device 500. An example of such an electronic component is a signal processing circuit which processes signals for the solid image capture element 502. Specifically, the signal processing circuit functions as a control section (image processing device) which controls operation of the solid image capture element 502 and suitably processes signal outputs of the solid image capture element 502 to produce necessary signals. The signal processing circuit may contain various electronic components: for example, an amplifier circuit section (analog signal circuit section) amplifying electrical signals obtained by conversion by the light receiving elements in the light receiving section 521 to output the amplified electrical signals as analog signals, an A/D conversion circuit section converting the analog signals to digital signals, a DSP (digital signal processor) controlling operation of the solid image capture element 502, a CPU executing various computation according to computer programs, a ROM containing the computer programs, and a RAM storing data for the various processes. Other examples of the electronic components include resistors and capacitors.

The solid image capture device 500 allows the external light picked up by a lens (not shown) to reach the inside of the solid image capture element 502 via the transparent lid section 503 so that the light form an image on the light receiving elements in the light receiving section 521 of the solid image capture element 502. The solid image capture device 500 contains an empty space between the light receiving section 521 and the transparent lid section 503. Therefore, the light, after passing through the transparent lid section 503, hits the light receiving section 521 without experiencing any interruption. No part of the light is lost along that particular segment of the optical path.

As detailed above, the holder 504 is fixed to the wiring board 501 in the solid image capture device 500 by the holder 504 being anchored to the wiring board 501. The holder 504, when anchored to the wiring board 501, presses the transparent lid section 503 in a direction normal to the light receiving surface (light receiving section 521) of the solid image capture element 502. The anchoring of the holder 504 to the wiring board 501 and the pressure exerted on the holder 504 secures the solid image capture element 502 onto the wiring board 501. Hence, the embodiment does not require conventional adhesion (for example, by using an adhesive) or compression (under physical pressure) in mounting the solid image capture element 502 to the wiring board 501.

Also, the holder 504 can be removed from the wiring board 501 (and re-anchored to the wiring board 501). Should the wiring board 501 or the solid image capture element 502 malfunction, it can be readily replaced.

The holder 504 can be placed precisely on the wiring board 501 because the holder 504 is anchored to the wiring board 501. This structure enables the solid image capture element 502 disposed inside the holder 504 to be placed precisely on the wiring board 501.

In the solid image capture device 500 according to the present embodiment as detailed above, the solid image capture element 502 can be fixed onto the wiring board 501 without involving adhesion or compression, and the solid image capture element 502 can be placed precisely on the wiring board 501.

Figure 17:
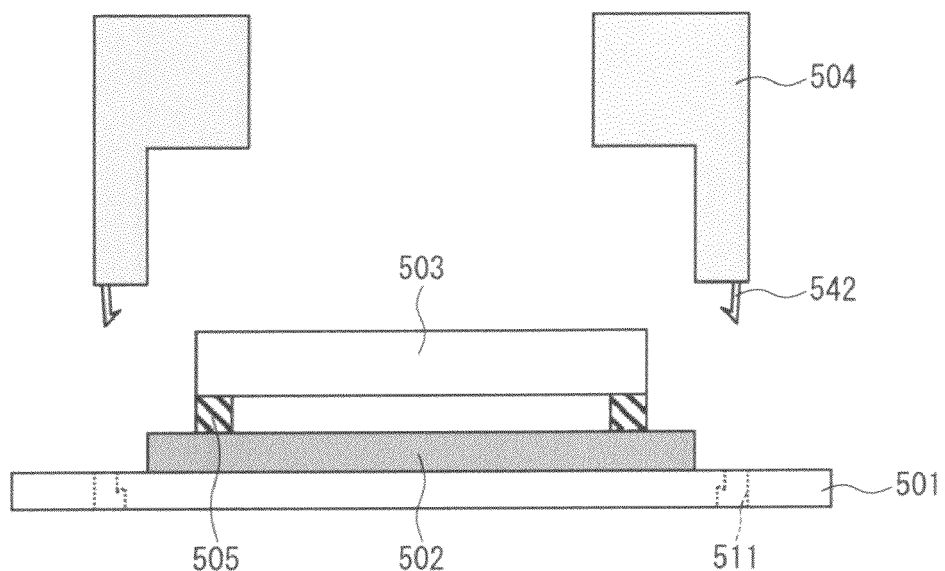
FIG. 17 is a cross-sectional view illustrating how a holder is anchored to a wiring board in the solid image capture device shown in FIG. 13.
Figure 17:
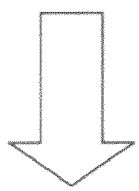
Figure 17:
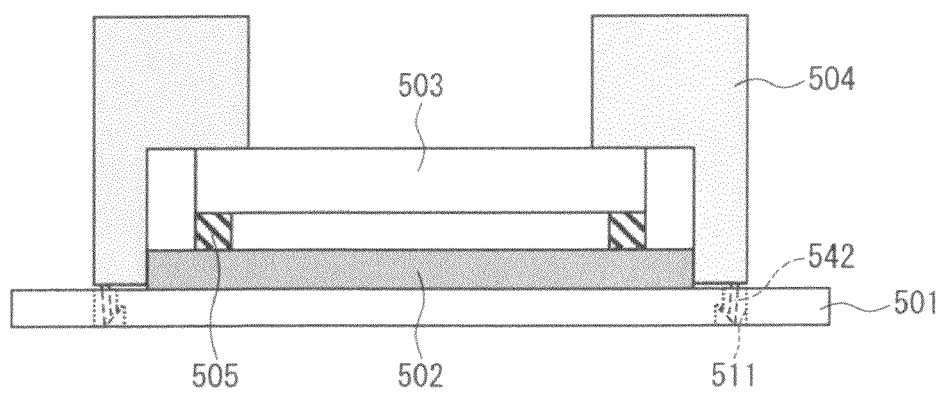
Figure 18:
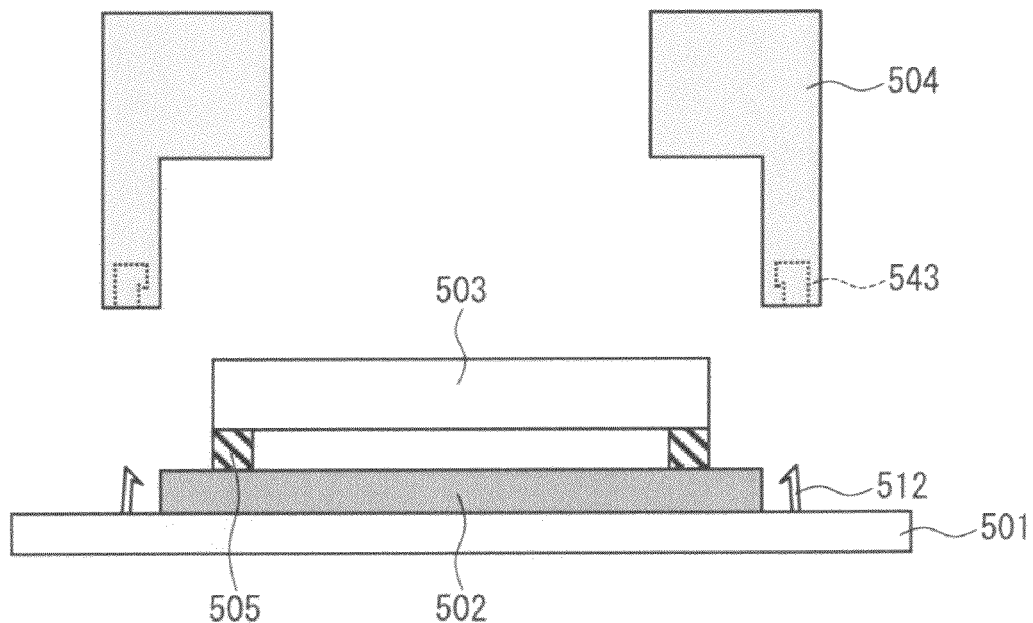
FIG. 18 is a cross-sectional view illustrating how a holder is anchored to a wiring board in the solid image capture device shown in FIG. 13.
Figure 18:
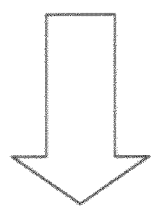
Figure 18:
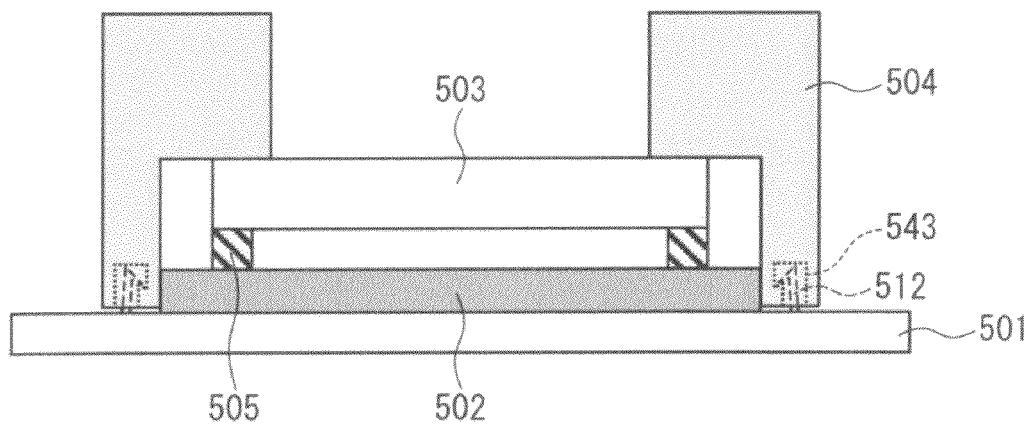
Figure 19:
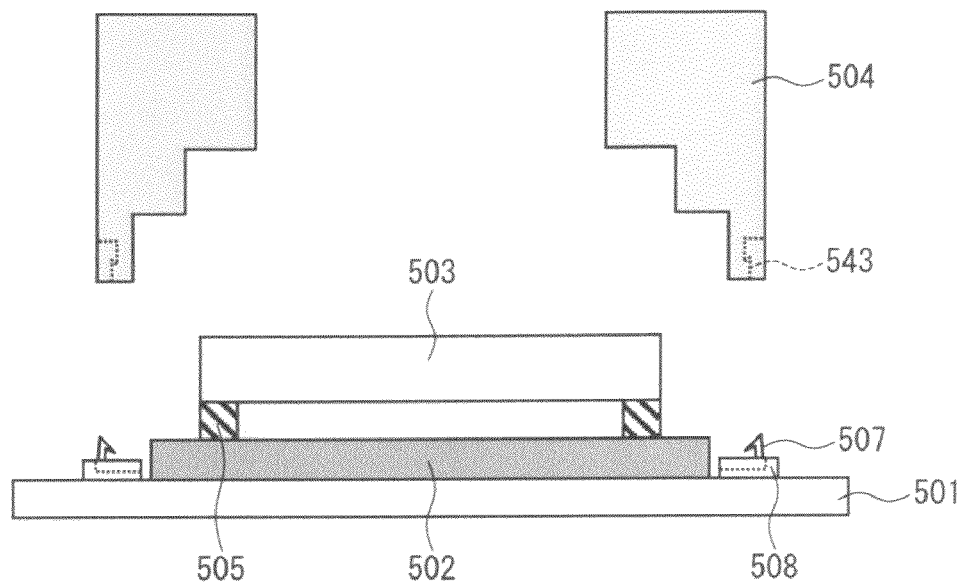
FIG. 19 is a cross-sectional view illustrating how a holder is anchored to a wiring board in the solid image capture device shown in FIG. 13.
Figure 19:
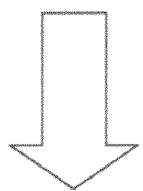
Figure 19:
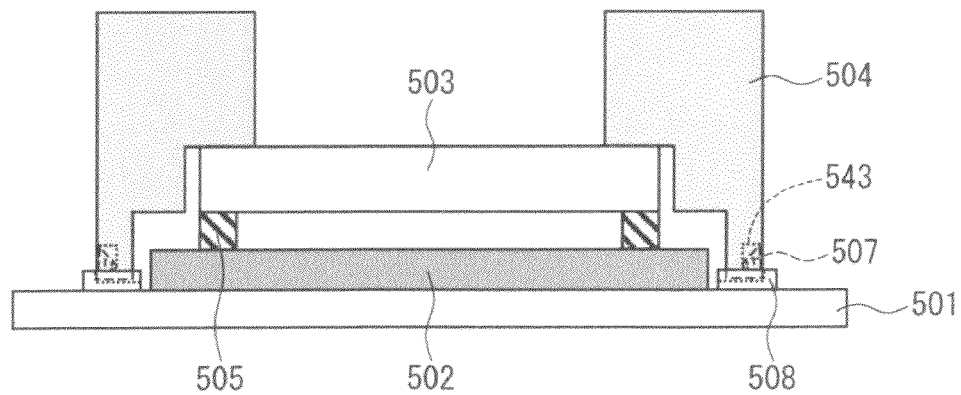

Details are now given about how the holder 504 is anchored to the wiring board 501. FIGS. 17 to 19 are cross-sectional views of the holder 504 anchored to the wiring board 501. As shown in these figures, the anchoring of the holder 504 to the wiring board 501 is achieved by, for example, hooks formed on either one of the wiring board 501 and the holder 504 and notches, formed on the other one, with which the hooks engage. The anchoring enables positioning of the holder 504 on the wiring board 501.

Specifically, referring to FIG. 17, the holder 504 is provided on its bottom with anchoring hooks 542. The wiring board 501 is provided with notches 511 with which the hooks 542 engage. The hooks 542, as they are caught by the notches 511, engage with the notches 511. The engagement secures the holder 504 in place on the wiring board 501. Put differently, the holder 504 is fixed to the wiring board 501 when the holder 504 is held in place on the wiring board 501. The holder 504 in this anchored state pushes down the top face of the transparent lid section 503 (moving closer to the solid image capture element 502). That in turn fixes the solid image capture element 502 when the element 502 is precisely placed on the wiring board 501. Therefore, the solid image capture device 500 requires neither adhesive nor compression in mounting the solid image capture element 502 to the wiring board 501. Also, the anchoring structure of the holder 504 to the wiring board 501 allows attaching/detaching of the holder 504. Should the wiring board 501 or the solid image capture element 502 malfunction, it can be readily replaced. The hooks 542 may be formed, for example, simultaneously with the holder 504 by resin molding in a die. The structure in FIG. 17 is the simplest and easiest-to-manufacture.

The notches 511 and hooks 542 are transposed in FIG. 18 when compared with those in FIG. 17. Concretely, in FIG. 18, the wiring board 501 is provided with anchoring hooks 512, and the holder 504 is provided on its bottom with notches 543 with which the hooks 512 engage. The same effects are achieved with this structure as with the structure in FIG. 17. The hooks 512 may be formed, for example, by resin molding and fixed onto the wiring board 501. The structure in FIG. 18 is effective when the notches 511 cannot be formed on the wiring board 501 (for example, due to lack of space and required strength).

FIG. 19 depicts hooks 507 formed on a pedestal 508 in place of the hooks 512 formed on wiring board 501 in FIG. 18. The hooks 507 engage with the notches 543 formed on the holder 504. The pedestal 508 is a frame around the solid image capture element 502 on the wiring board 501. The solid image capture element 502 is disposed inside the pedestal 508. Metal terminals (not shown) are formed on the "back" face of the pedestal 508 which contacts the wiring board 501. The pedestal 508 is surface mounted by soldering the back of the pedestal 508 to the wiring board 501. The same effects are achieved with this structure as with the structure in FIG. 17. The surface mounting of the pedestal 508 on the wiring board 501 by soldering in FIG. 19 is effective when the wiring board 501 carries other surface mounted components. The surface mounting also allows for increased freedom in the design of the wiring pattern of the wiring board 501, which leads to a lower unit price of the wiring board 501. The structure of the pedestal 508 will be detailed later.

Figure 20:
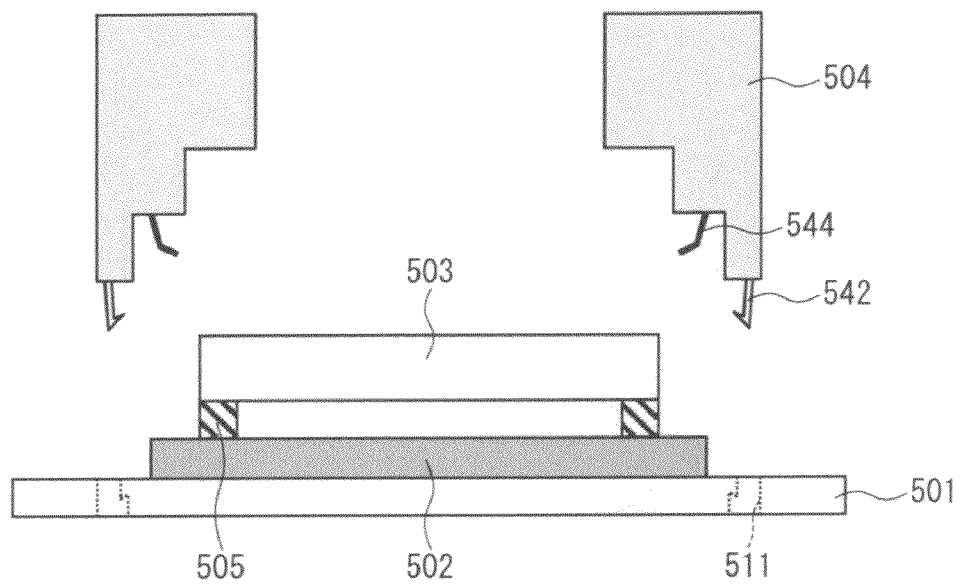
FIG. 20 is a cross-sectional view of exemplary electrical connection between the solid image capture element and a holder in the solid image capture device shown in FIG. 13.
Figure 20:
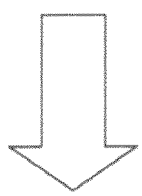
Figure 20:
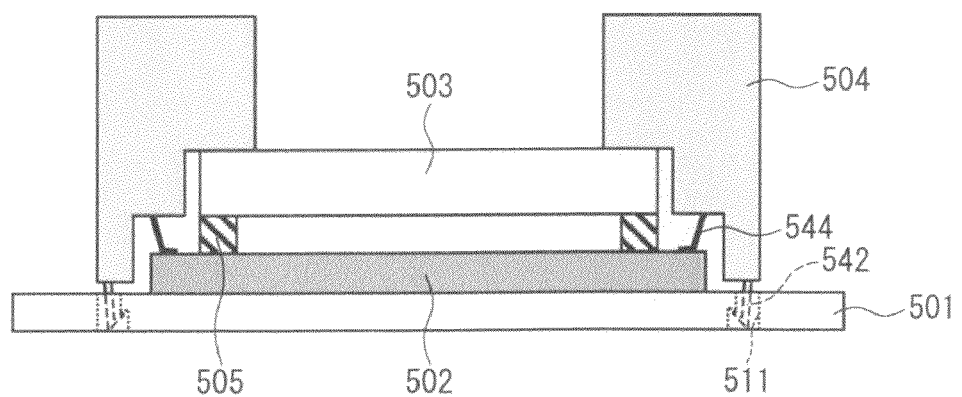
Figure 21:
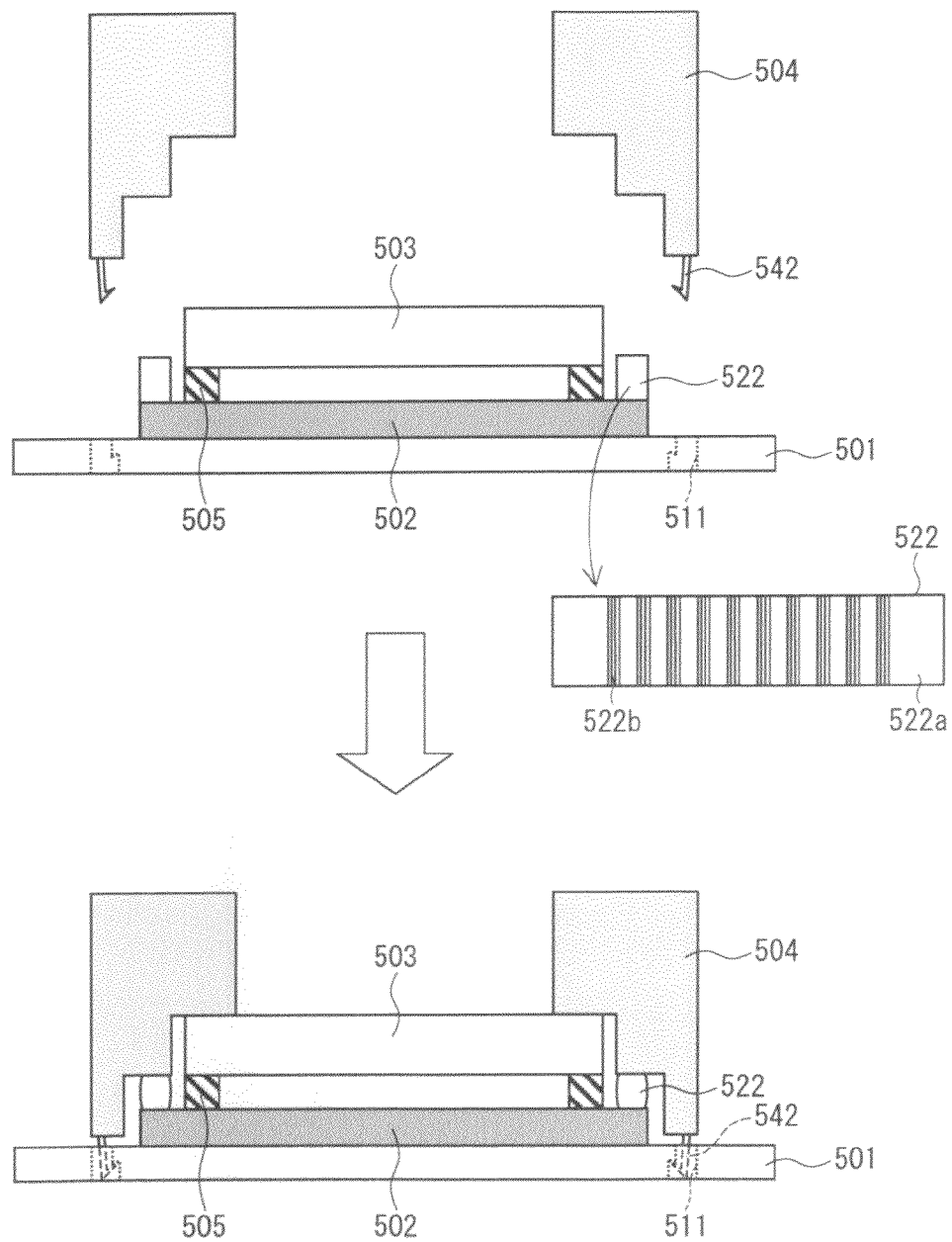
FIG. 21 is a cross-sectional view of exemplary electrical connection between the solid image capture element and a holder in the solid image capture device shown in FIG. 13.

Next will be described electrical connection between the wiring board 501 and the solid image capture element 502 in the solid image capture device 500. The solid image capture device 500 is not limited in any particular manner in terms of how electrical signals should be taken out from the solid image capture element 502 and fed to the wiring board 501. For example, electrical signals from the solid image capture element 502 may be passed directly to the wiring board 501 or routed via the holder 504 before being fed to the wiring board 501. FIGS. 20 to 21 are cross-sectional views of exemplary electrical connection between the solid image capture element 502 and the holder 504. Either one of the holder 504 and the solid image capture element 502, in these arrangements, is provided with a connecting section electrically connecting the holder 504 and the solid image capture element 502. The connecting section is adapted to come into contact with the holder 504 and the solid image capture element 502 when the holder 504 is anchored to the wiring board 501. The structure enables transmission of electrical signals from the solid image capture element 502 to the wiring board 501 via the connecting section.

A more concrete description is given. FIG. 20 depicts an example in which probe pin terminals 544 are used as the connecting section. The probe pin terminals 544 are formed on an internal face of the holder 504 in FIG. 20. The probe pin terminals 544 come into contact with electrode terminals (not shown) formed on the solid image capture element 502 when the holder 504 is anchored to the wiring board 501. The structure enables transmission of electrical signals from the solid image capture element 502 to the wiring board 501 via the probe pin terminals 544.

The use of the probe pin terminals 544 results in pressure building up on the tips of the probe pins. The pressure works in favor of setting up contacts between the probe pin terminals 544 and the electrode terminals (pad terminals) formed on the solid image capture element 502. Apart from that, the tips of the probe pin terminals 544 scratch the electrode terminals on the solid image capture element 502 upon setting up the contacts, scraping oxidation and various dirt off the surface of the electrode terminals on the solid image capture element 502. The scraping maintains the contacts between the probe pin terminals 544 and the electrode terminals on the solid image capture element 502 in good condition. Reliable contacts are thus established between the solid image capture element 502 and the wiring board 501 via the probe pin terminals 544.

FIG. 21 depicts an example in which electrically conductive rubber 522 is used as the connecting section. The electrically conductive rubber 522 is provided outside and along the adhesive section 505 on the solid image capture element 502 as shown in FIG. 21 and is composed of a resin section 522a made of rubber (elastomer) and conduction sections 522b made of multiple copper lines as schematically shown in FIG. 21. The conduction sections 522b are adapted to conduct only in the vertical direction. The structure enables transmission of electrical signals from the solid image capture element 502 to the wiring board 501 via the electrically conductive rubber 522. The inclusion of the copper lines in the conduction sections 522b enables conduction between the solid image capture element 502 and the holder 504 without having to dispose the electrically conductive rubber 522 strictly in alignment with terminals (not shown) formed for electrical connection between the solid image capture element 502 and the holder 504. The electrically conductive rubber 522, being elastic, acts as a cushion when the transparent lid section 503 is held down too much by the holder 504. The electrically conductive rubber 522 therefore reliably prevents the transparent lid section 503 from breaking.

FIGS. 20 and 21 depict the holder 504 anchored to the wiring board 501 similarly to the structure in FIG. 17. The structures in FIG. 18 and FIG. 19 may be employed instead.

Figure 22:
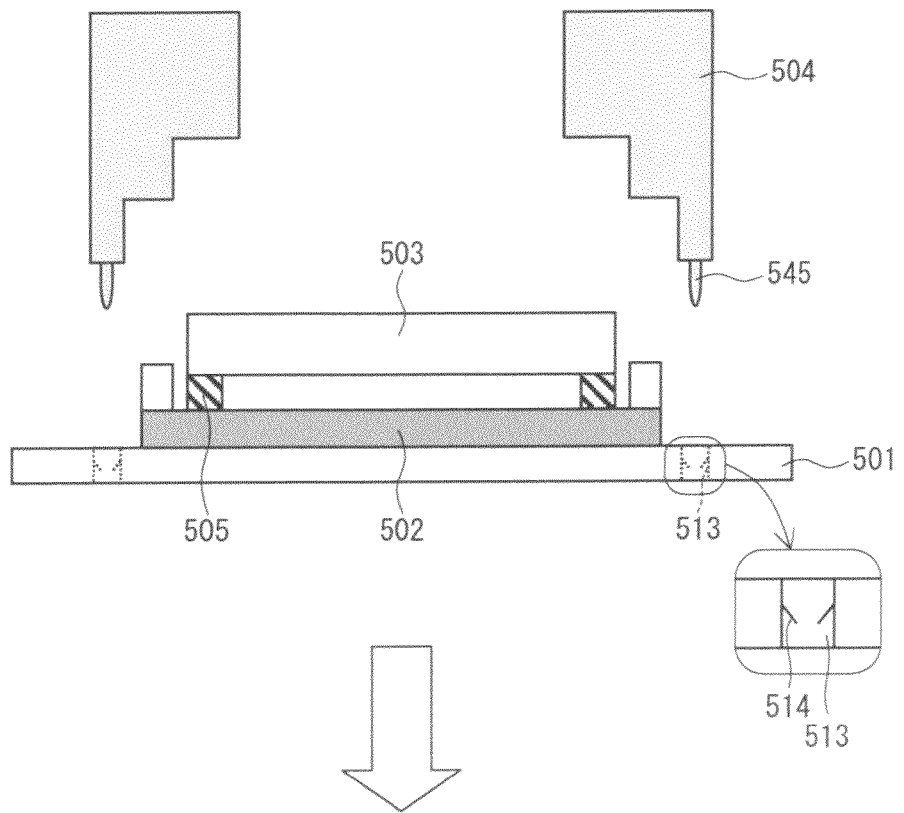
FIG. 22 is a cross-sectional view of exemplary electrical connection between a wiring board and a holder in the solid image capture device shown in FIG. 13.
Figure 22:
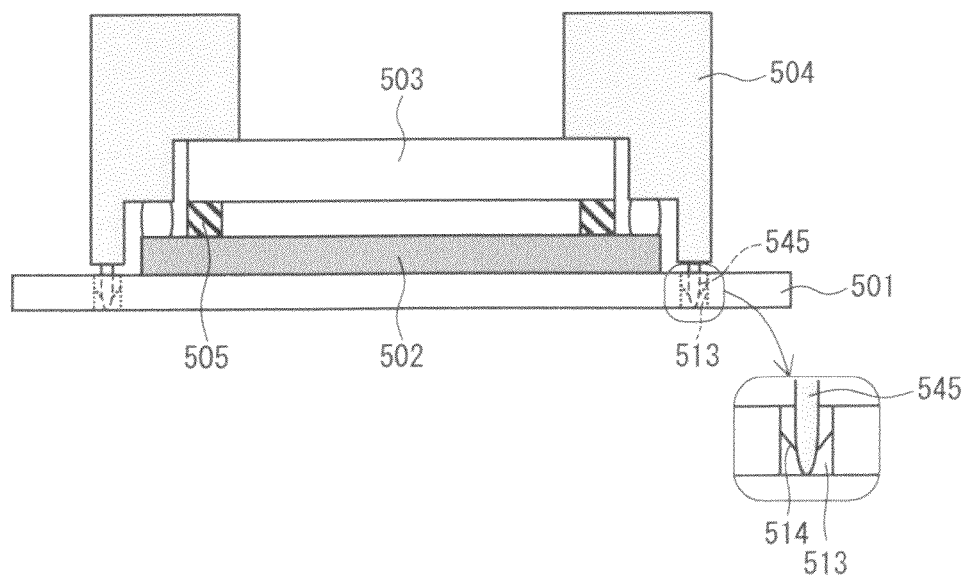
Figure 23:
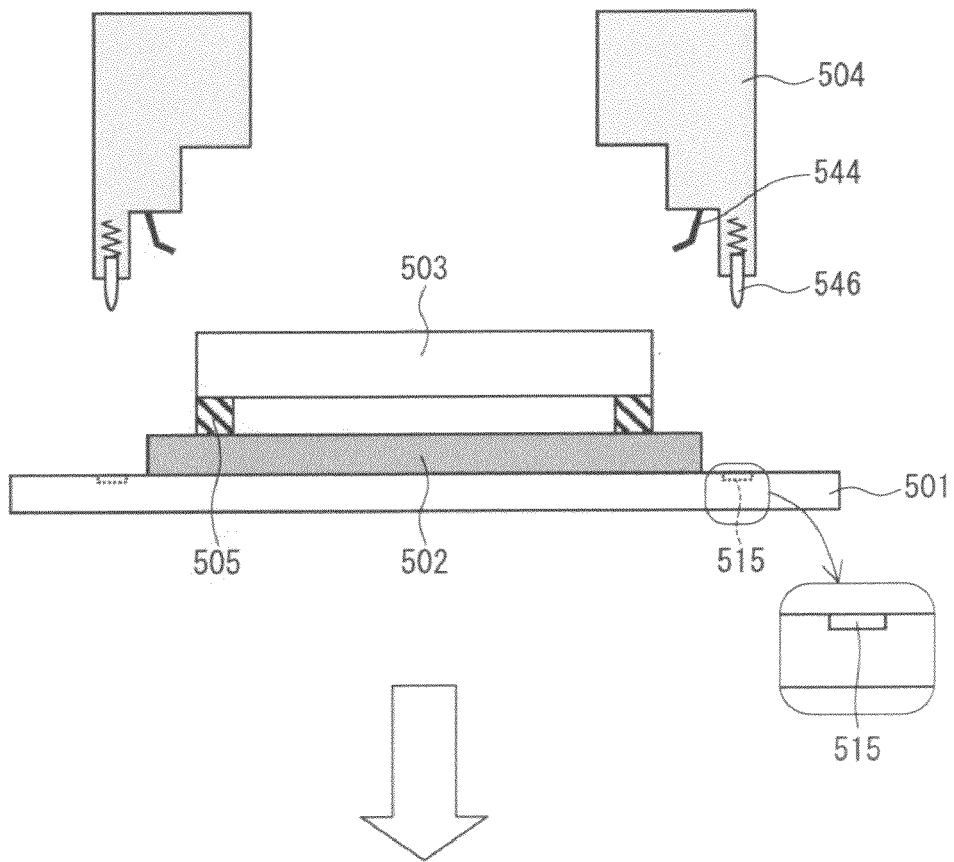
FIG. 23 is a cross-sectional view of exemplary electrical connection between a wiring board and a holder in the solid image capture device shown in FIG. 13.
Figure 23:
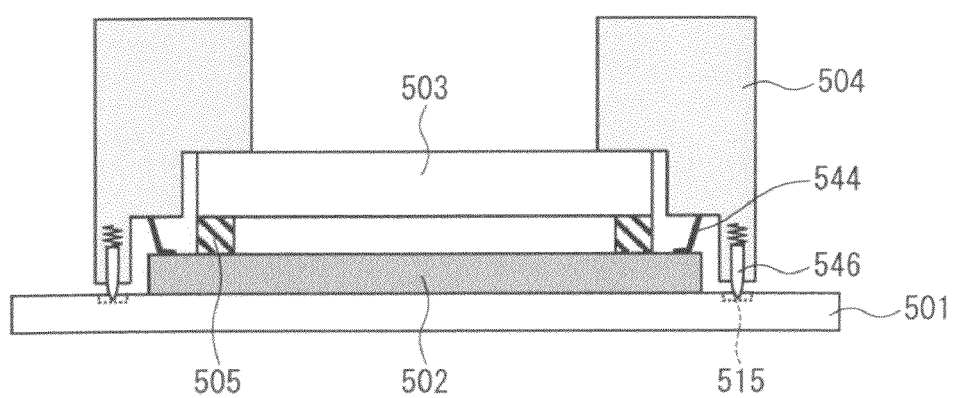
Figure 24:
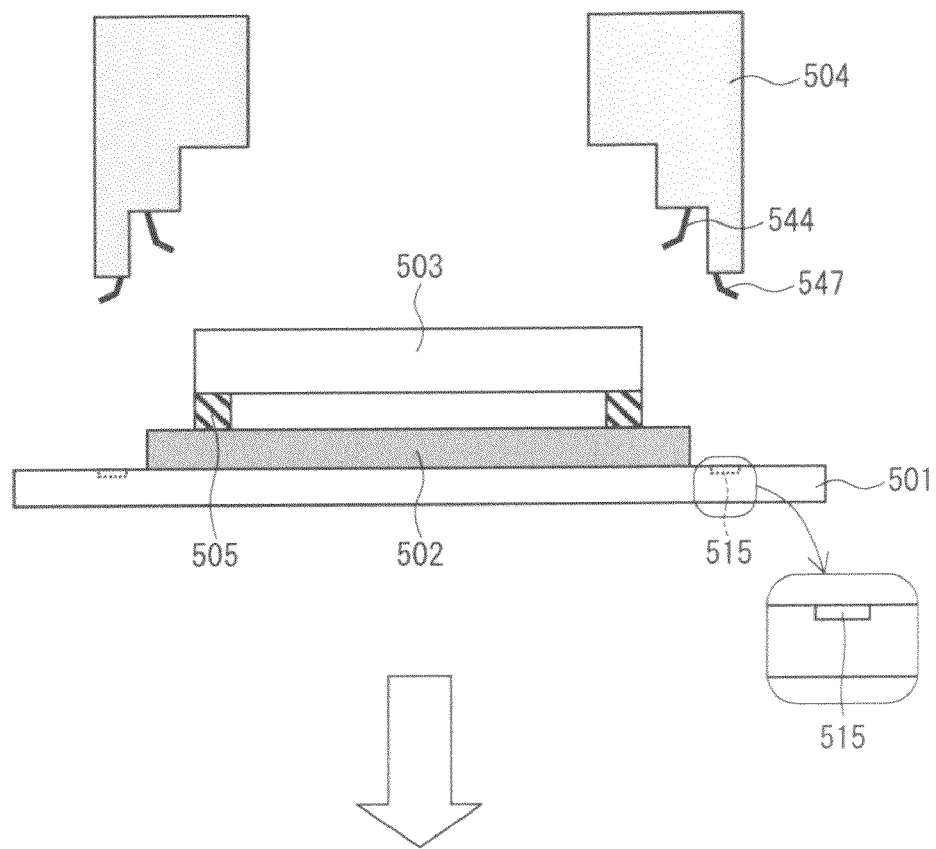
FIG. 24 is a cross-sectional view of exemplary electrical connection between a wiring board and a holder in the solid image capture device shown in FIG. 13.
Figure 24:
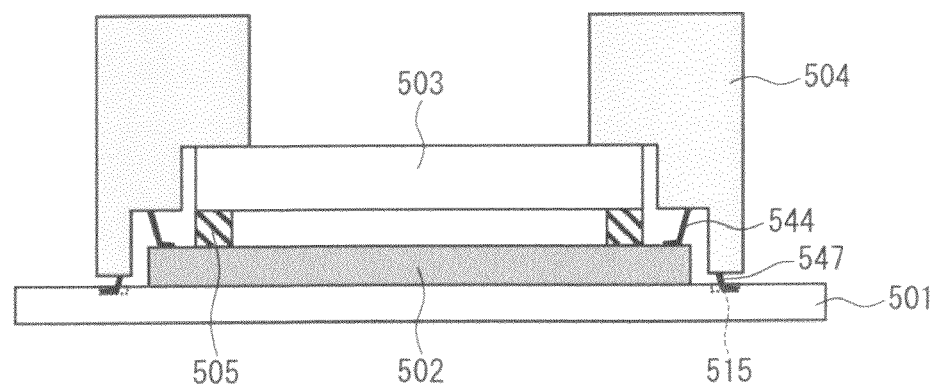

Next will be described electrical connection between the wiring board 501 and the holder 504 in the solid image capture device 500. FIGS. 22 to 24 are cross-sectional views of exemplary electrical connection between the wiring board 501 and the holder 504. Terminals are provided on both the wiring board 501 and the holder 504 in these structures. The terminals on the wiring board 501 come into contact with those on the holder 504 when the holder 504 is anchored to the wiring board 501. The wiring board 501 and the holder 504 are hence electrically connected only when the holder 504 is anchored to the wiring board 501. The structure therefore does not allow electrical connection to be formed between the wiring board 501 and the holder 504 if the holder 504 is mounted to the wiring board 501 in a wrong way. One can hence achieve reliable positioning of the holder 504 on the wiring board 501.

Specifically, in the structure shown in FIG. 22, pin terminals 545 are formed protruding from the bottom of the holder 504. The wiring board 501 is provided with through holes 513 to which the pin terminals 545 are inserted. Probes 514 are provided in each through hole 513 of the wiring board 501. As the holder 504 is anchored to the wiring board 501, the pin terminals 545 fit in the through holes 513 and come into contact with the probes 514, establishing electrical connection between the wiring board 501 and the holder 504.

In the structure shown in FIG. 23, spring-loaded terminals 546 are formed protruding from the bottom of the holder 504. The spring-loaded terminals 546 withdraw into the holder 504 under load. The wiring board 501 is provided with flat terminals 515. As the holder 504 is anchored to the wiring board 501, the spring-loaded terminals 546 contact the terminals 515 on the wiring board 501. As a result, the spring-loaded terminals 546 receive a force moving away from the wiring board 501 and withdraw into the holder 504. The action establishes electrical connection between the wiring board 501 and the holder 504.

The spring-loaded terminals 546 in FIG. 23 are replaced by probe pin terminals 547 in FIG. 24. The probe pin terminals 547 receive pressure building up on the tips of the probe pins, similarly to the probe pin terminals 544. The pressure works in favor of setting up contacts between the probe pin terminals 547 and the terminals 515 formed on the wiring board 501. Apart from that, the tips of the probe pin terminals 547 scratch the terminals 515 on the wiring board 501 upon setting up the contacts, scraping wiring oxidation and various dirt off the surface of the terminals 515 of the wiring board 501. The scraping maintains the contacts between the probe pin terminals 547 and the terminals 515 on the wiring board 501 in good condition. Reliable contacts are thus established between the wiring board 501 and the holder 504 via the probe pin terminals 547.

The provision of the flat terminals 515 on the wiring board 501 as shown in FIGS. 23 and 12 eliminates the need to form the through holes 513 on the wiring board 501 as shown in FIG. 22. That simplifies the structure of the wiring board 501. The holder 504 in FIGS. 22 to 24 may be anchored to the wiring board 501 by any of the structures shown in FIGS. 17 to 19.

Figure 25:
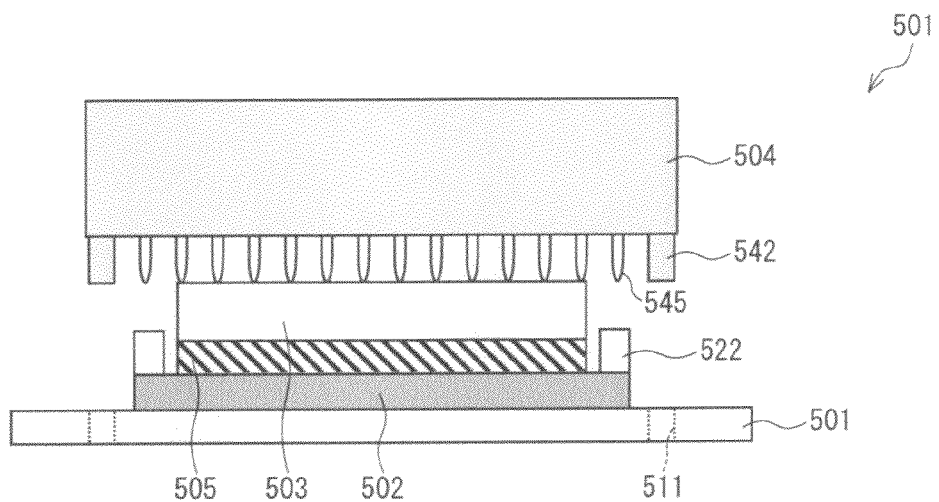
FIG. 25 is a side view and a cross-sectional view of another solid image capture device in accordance with the present invention.
Figure 28:
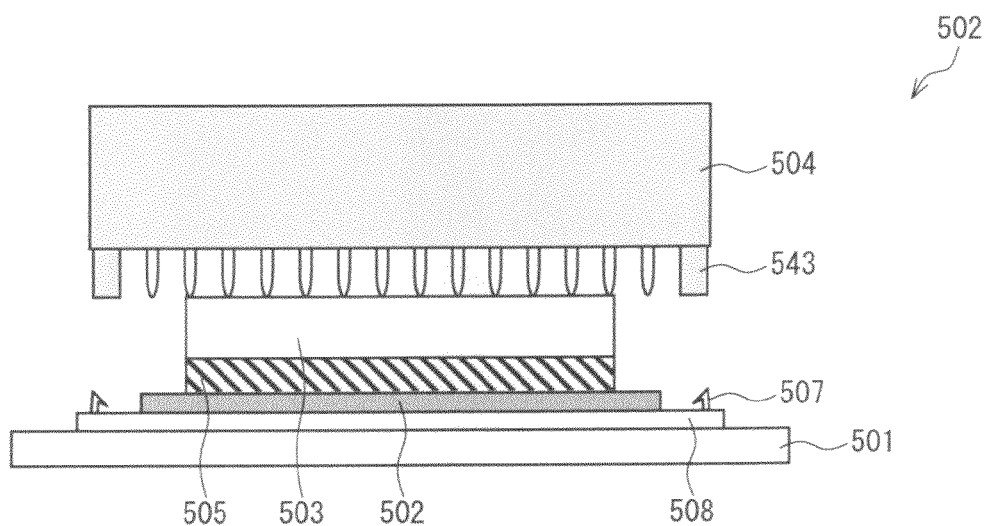
FIG. 28 is a side view and a cross-sectional view of another solid image capture device in accordance with the present invention.

The solid image capture device 500 of the present embodiment may incorporate any suitable combination of the structures in FIGS. 17 to 24, to transmit electrical signals from the solid image capture element 502 to the wiring board 501 via the holder 504. FIGS. 25 and 28 are cross-sectional views of an exemplary combination.

Figure 26:
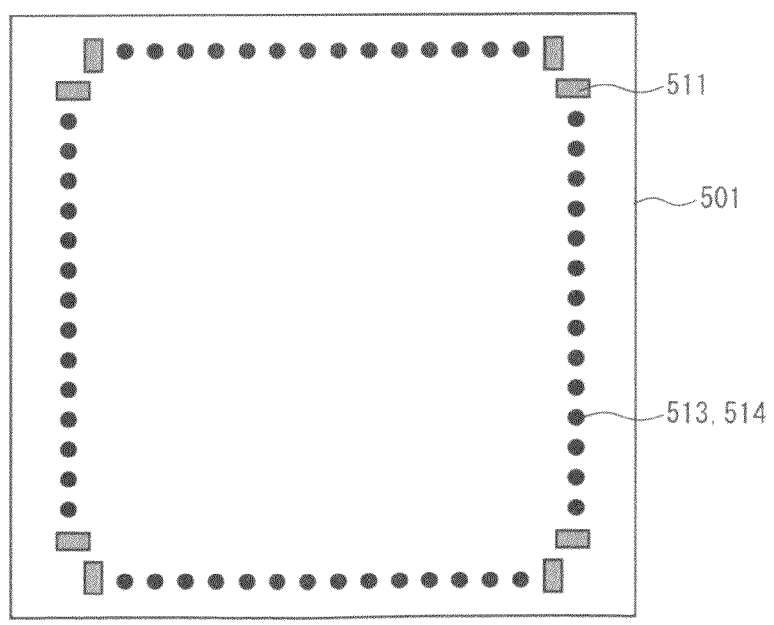
FIG. 26 is a top view of a wiring board in the solid image capture device shown in FIG. 25.
Figure 27:
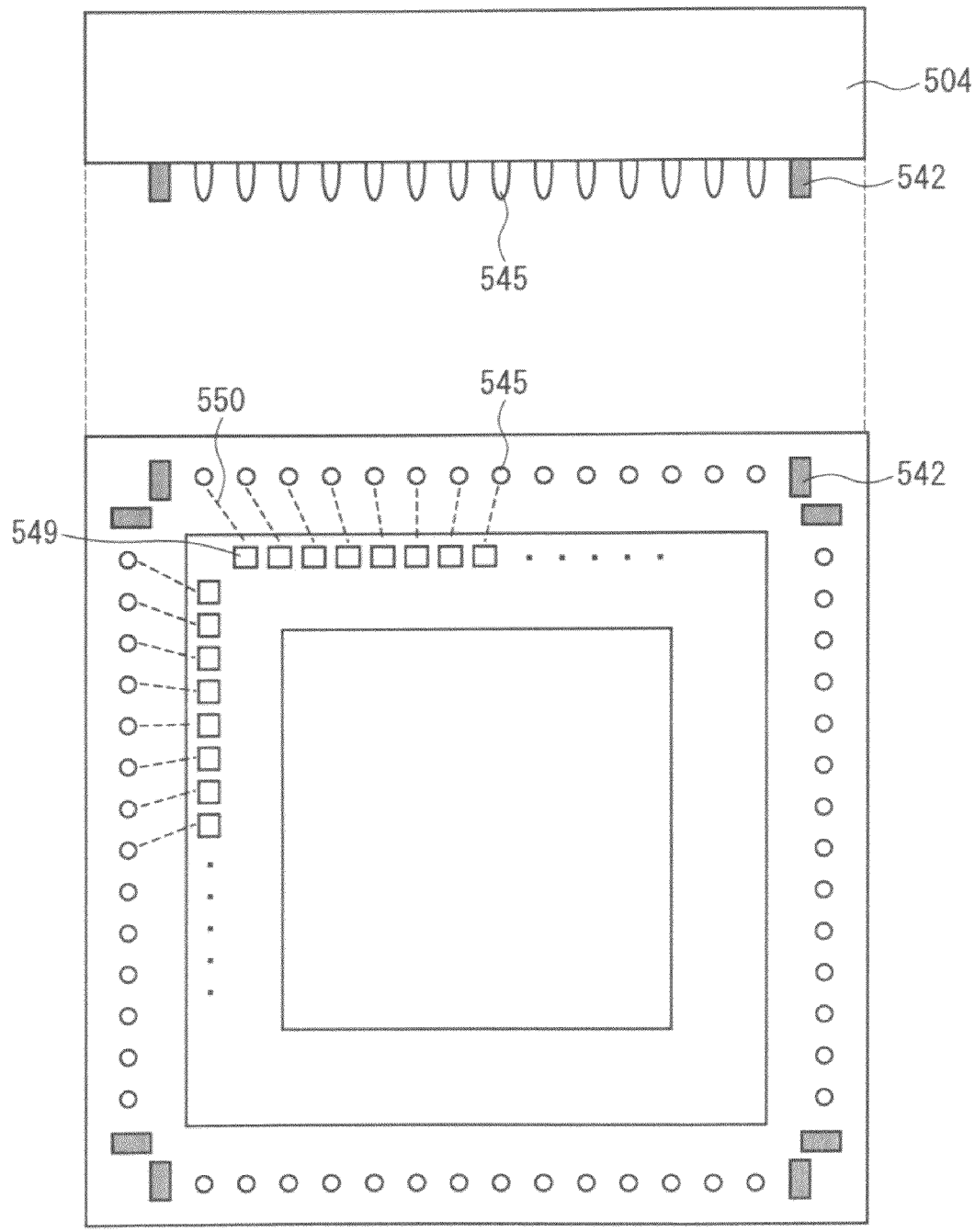
FIG. 27 is a back view of a holder in the solid image capture device shown in FIG. 25.

FIG. 25 depicts a solid image capture device 501 incorporating a combination of the structures shown in FIGS. 17, 21, and 22. In the solid image capture device 501 shown in FIG. 25, the wiring board 501 and the holder 504 are structured, for example, as shown in FIGS. 26 and 15. FIG. 26 is a top view of the wiring board 501 (showing the side facing the holder 504) in the solid image capture device 501 shown in FIG. 25. FIG. 27 is a back view of the holder 504 (showing the side facing the wiring board 501) in the solid image capture device 501 shown in FIG. 25. Referring to FIG. 26, the wiring board 501 is provided along its periphery with the notches 511, the through holes 513, and the probes 514. The holder 504 is provided with the hooks 542 formed at sites corresponding to the notches 511 on the wiring board 501 and the pin terminals 545 formed at sides corresponding to the through holes 513 and the probes 514. Therefore, as the wiring board 501 is placed on the holder 504, the hooks 542 engage with the notches 511. At the same time, the pin terminals 545 are inserted into the through holes 513, and the pin terminals 545 come into contact with the probes 514. That establishes electrical connection between the wiring board 501 and the holder 504.

Referring to FIG. 27, terminals 549 are provided inside the area where the pin terminals 545 are provided. The electrically conductive rubber 522 comes into contact with the terminals 549 when the holder 504 is placed on the wiring board 501. The pin terminals 545 are connected to the terminals 549 via wires 550.

The structure enables transmission of electrical signals from the solid image capture element 502 sequentially to the electrically conductive rubber 522, the terminals 549, the pin terminals 545, and the wiring board 501.

Figure 29:
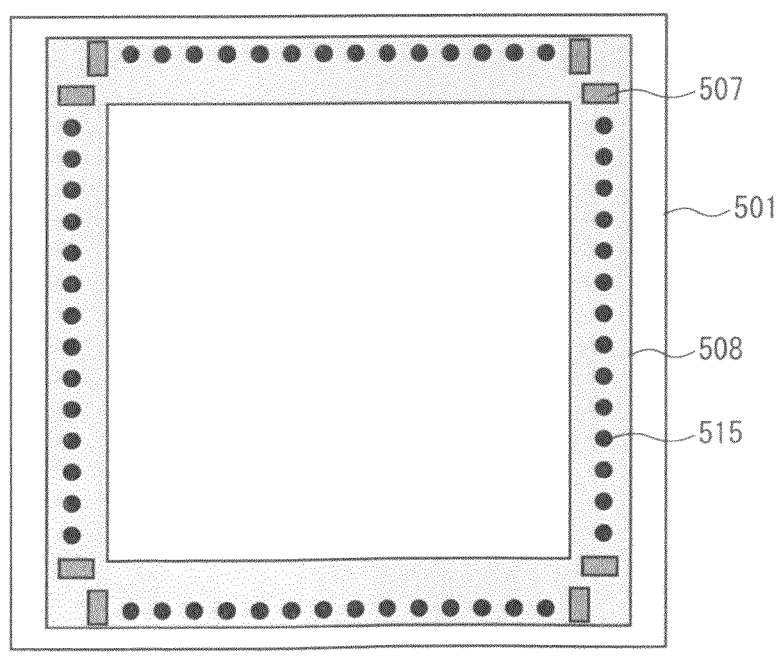
FIG. 29 is a top view of a wiring board and a pedestal in the solid image capture device shown in FIG. 28.
Figure 30:
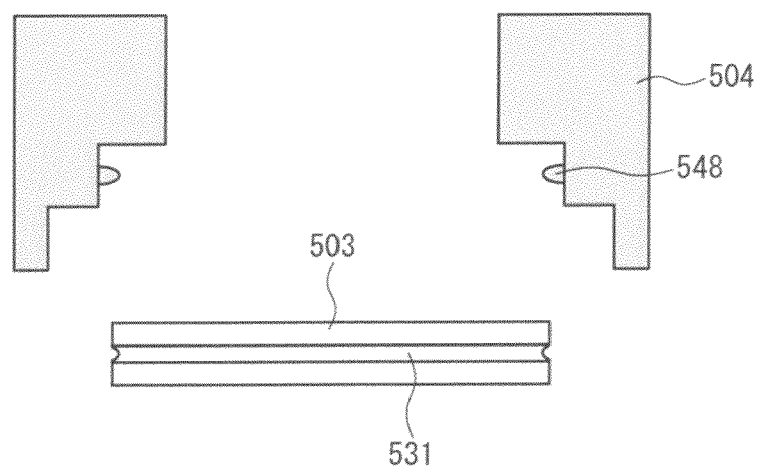
FIG. 30 is a cross-sectional view illustrating how projections provided on a holder fit in a groove provided on side faces of a transparent lid section in a solid image capture device in accordance with the present invention.
Figure 30:
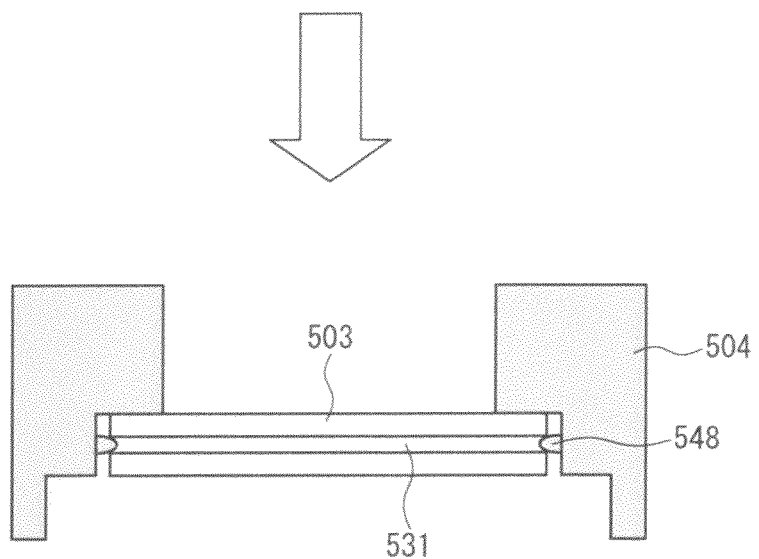
Figure 31:
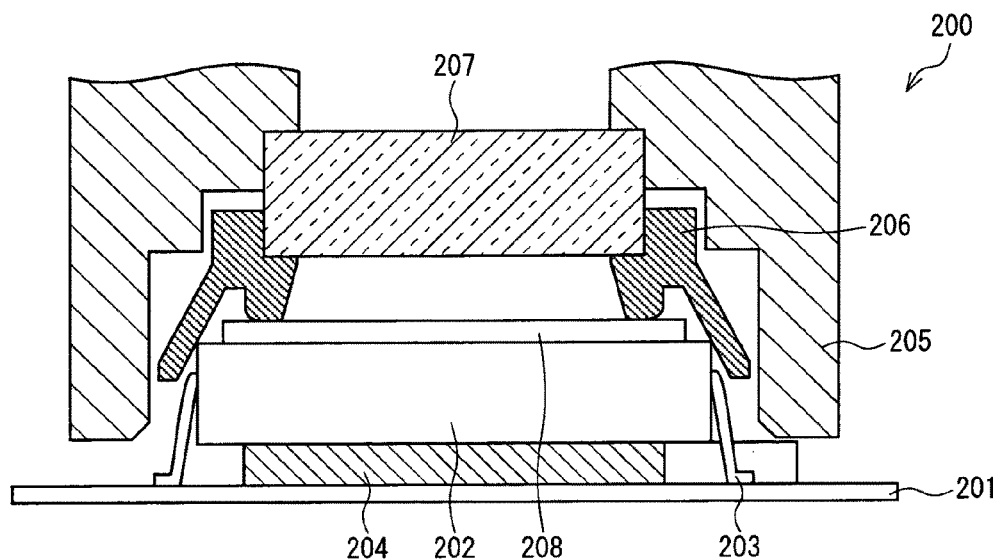
FIG. 31 is a cross-sectional view of a solid image capture device according to patent document 1.
Figure 32:
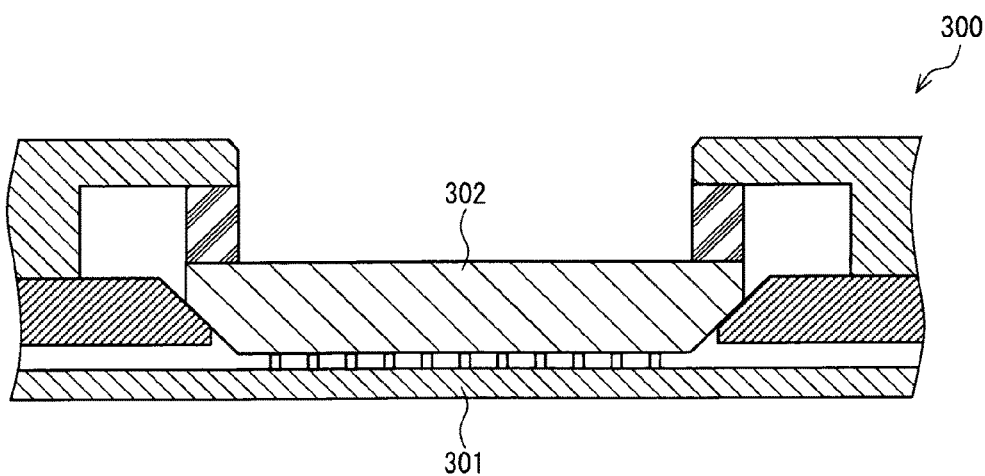
FIG. 32 is a cross-sectional view of a solid image capture device according to patent document 2.
Figure 33:
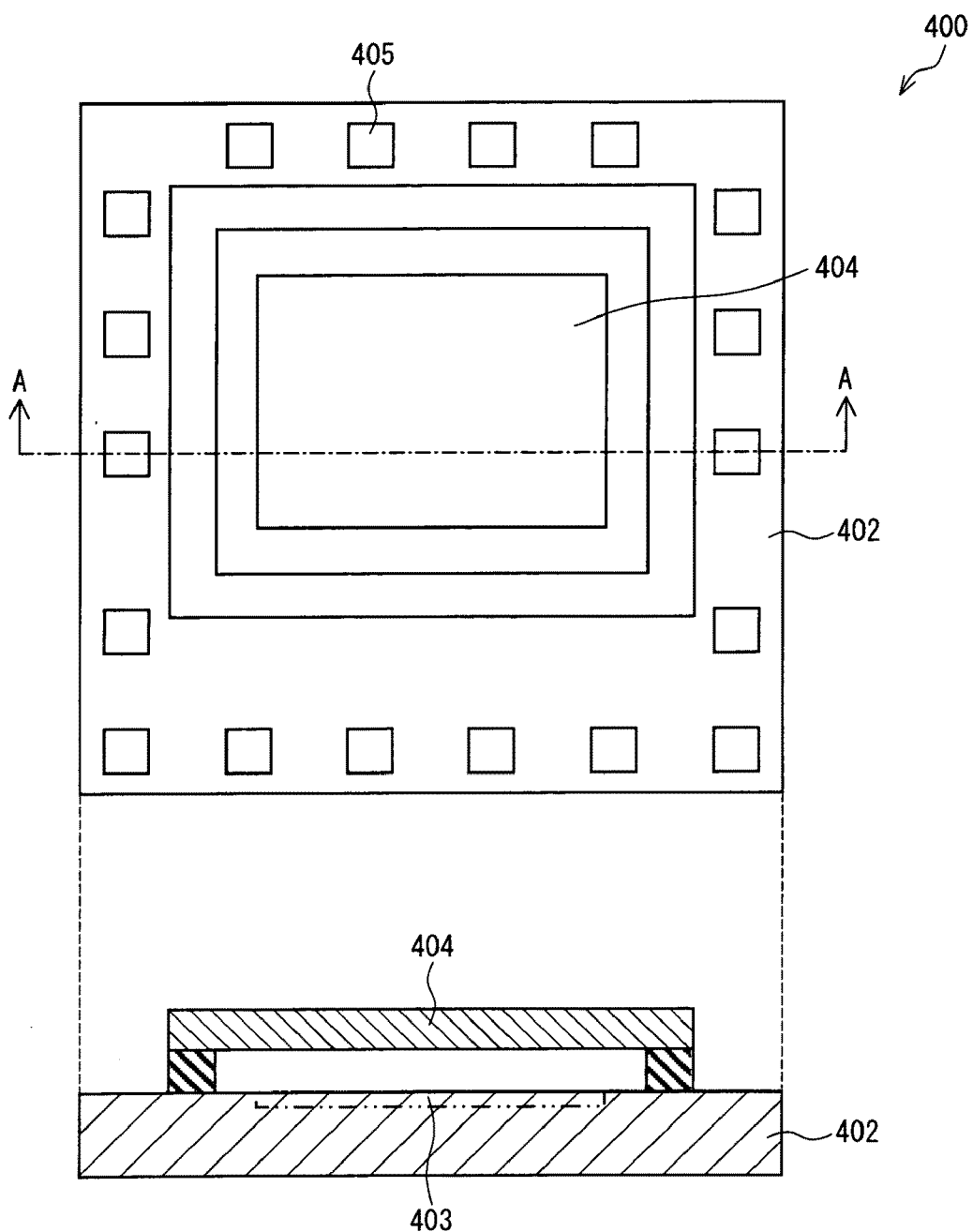
FIG. 33 is a plan view and a cross-sectional view of a solid image capture device according to patent document 3.

FIG. 28 depicts a solid image capture device 102 incorporating a combination of the pedestal 508 shown in FIG. 19 and the structure shown in FIGS. 20 and 23. FIG. 29 is a top view of the wiring board 501 and the pedestal 508 in the solid image capture device 102 shown in FIG. 28. The solid image capture device 102 is not drawn in a figure because it includes a holder 504 having a similar structure to the one in FIG. 27: differences are found where the notches 543 and the spring-loaded terminals 546 replace the hooks 542 and the pin terminals 545 on the holder 504 in FIG. 27.

The pedestal 508 is provided thereon with the hooks 507 and the terminals 515 as shown in FIG. 29. The holder 504 is provided with the notches 543 (see FIG. 19) at sites corresponding to the hooks 507 on the pedestal 508 and the spring-loaded terminals 546 (see FIG. 23) at sites corresponding to the terminals 515 on the pedestal 508. Therefore, as the holder 504 is placed on the pedestal 508, the hooks 507 engage with the notches 543. At the same time, the spring-loaded terminals 546 come into contact with the terminals 515. That establishes electrical connection between the wiring board 501 and the holder 504.

The structure detailed above enables transmission of electrical signals from the solid image capture element 502 to the wiring board 501 via the holder 504 in the solid image capture devices 501, 102. This description of the structures is however by no means intended to be limiting the scope of the present invention.

In the foregoing examples, the side faces of the transparent lid section 503 were assumed to be flat. Alternatively, the side faces of the transparent lid section 503 may have a groove 531 as shown in FIG. 18, and the holder 504 may have projections 548 which fit in the groove 531 when the holder 504 is anchored to the wiring board 501. The mechanism enables high precision placement of the holder 504 and the solid image capture element 502 on the wiring board 501.

The solid image capture device in accordance with the present invention is suited for application in camera-equipped mobile phones, digital still cameras, video cameras, security cameras, and like electronic imaging devices. The structures detailed above enable the solid image capture device to be reliably attached and fixed to an image capture section of the electronic devices.

As described in the foregoing, the solid image capture device in accordance with the present invention includes a holder provided on a wiring board to encase therein a solid image capture element except for a light receiving section. The holder is anchored to the wiring board to hold down a transparent lid section in a direction normal to a light receiving surface of the solid image capture element toward the solid image capture element. These features advantageously allow attaching/detaching of the solid image capture element to/from the wiring board, which in turn enables easy positioning of the solid image capture element on the wiring board.

The solid image capture device in accordance with the present invention may be adapted so that: either one of the wiring board and the holder has hooks; and the other has notches with which the hooks engage.

According to this aspect of the invention, the anchoring hooks engage with the notches, anchoring the holder to the wiring board. The mechanism enables positioning of the holder and the solid image capture element on the wiring board.

The solid image capture device in accordance with the present invention may further include a pedestal soldered onto the wiring board to surrounding the solid image capture element, wherein: either one of the pedestal and the holder has hooks; and the other has notches with which the hooks engage.

According to this aspect of the invention, the anchoring hooks engage with the notches, anchoring the holder to the wiring board. The mechanism enables positioning of the holder and the solid image capture element on the wiring board.

The solid image capture device in accordance with the present invention is preferably adapted so that: either the holder or the solid image capture element has a connecting section for electrical connection between the holder and the solid image capture element; and the connecting section comes into contact with the holder and the solid image capture element when the holder is anchored to the wiring board.

The structure includes a connecting section which comes into contact with the holder and the solid image capture element in a state in which the holder is anchored to the wiring board. Accordingly, the anchoring of the holder to the wiring board enables transmission of electrical signals from the solid image capture element to the wiring board via the connecting section.

In the solid image capture device in accordance with the present invention, the connecting section may be probe pin terminals. The anchoring of the holder to the wiring board enables transmission of electrical signals from the solid image capture element to the wiring board via the probe pin terminals.

In the solid image capture device in accordance with the present invention, the connecting section may be electrically conductive rubber. The anchoring of the holder to the wiring board enables transmission of electrical signals from the solid image capture element to the wiring board via the electrically conductive rubber.

The solid image capture device in accordance with the present invention may be adapted so that: both the wiring board and the holder have terminals; and the terminals of the wiring board and those of the holder come into contact when the holder is anchored to the wiring board.

According to this aspect of the invention, the wiring board and the holder are electrically connected only when the holder is anchored to the wiring board. The structure therefore does not allow electrical connection to be formed between the wiring board and the holder if the holder is mounted to the wiring board in a wrong way. One can hence achieve reliable positioning of the holder on the wiring board.

The electronic device of the present invention contains any one of the foregoing solid image capture devices. The feature enables the solid image capture element to be attached to and detached from the wiring board. The resultant electronic device thus allows easy positioning of the solid image capture element on the wiring board.

The solid image capture device in accordance with the present invention is suited for application in camera-equipped mobile phones, digital still cameras, video camera, security cameras, and like electronic imaging devices. The structures detailed above enable the solid image capture device to be reliably attached and fixed to an image capture section of the electronic device.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and examples described in Detailed Description of the Invention are for illustrative purposes only and by no means limit the scope of the present invention. Variations are not to be regarded as a departure from the spirit and scope of the invention, and all such modifications as would be obvious to one skilled in the art are intended to be included within the scope of the claims below.

What is claimed is:

1. A solid image capture device comprising:
   a solid image capture element;
   a wiring board to which the solid image capture element is mounted, the wiring board including wiring for electrical connection with the solid image capture element;
   a transparent lid section provided over the solid image capture element to cover a light receiving section of the solid image capture element with a gap being left between the transparent lid section and the light receiving section; and
   a holder provided on the wiring board to encase therein the solid image capture element except for the light receiving section,
   wherein
   the holder is anchored to the wiring board to hold down the transparent lid section in a direction normal to a light receiving surface of the solid image capture element toward the solid image capture element,
   the solid image capture device further comprising a pedestal soldered onto the wiring board to surround the solid image capture element,
   wherein:
   either one of the pedestal and the holder has hooks; and
   the other has notches with which the hooks engage.

2. The solid image capture device as set forth in claim 1, wherein: either one of the wiring board and the holder has hooks; and the other has notches with which the hooks engage.

3. The solid image capture device as set forth in claim 1, wherein the solid image capture element and the wiring board are secured together neither by adhesion nor by compression.

4. A solid image capture device comprising:
   a solid image capture element;
   a wiring board to which the solid image capture element is mounted, the wiring board including wiring for electrical connection with the solid image capture element;
   a transparent lid section provided over the solid image capture element to cover a light receiving section of the solid image capture element with a gap being left between the transparent lid section and the light receiving section; and
   a holder provided on the wiring board to encase therein the solid image capture element except for the light receiving section,
   wherein
   the holder is anchored to the wiring board to hold down the transparent lid section in a direction normal to a light receiving surface of the solid image capture element toward the solid image capture element,
   wherein:
   either the holder or the solid image capture element has a connecting section for electrical connection between the holder and the solid image capture element; and the connecting section comes into contact with the holder and the solid image capture element when the holder is anchored to the wiring board.

5. The solid image capture device as set forth in claim 4, wherein the connecting section is probe pin terminals.

6. The solid image capture device as set forth in claim 4, wherein the connecting section is electrically conductive rubber.

7. An electronic device comprising a solid image capture device including:
- a solid image capture element;
- a wiring board to which the solid image capture element is mounted, the wiring board including wiring for electrical connection with the solid image capture element;
- a transparent lid section provided over the solid image capture element to cover a light receiving section of the solid image capture element with a gap being left between the transparent lid section and the light receiving section; and
- a holder provided on the wiring board to encase therein the solid image capture element except for the light receiving section, wherein
the holder is anchored to the wiring board to hold down the transparent lid section in a direction normal to a light receiving surface of the solid image capture element toward the solid image capture element,
the solid image capture device further comprising a pedestal soldered onto the wiring board to surround the solid image capture element, wherein:
either one of the pedestal and the holder has hooks; and
the other has notches with which the hooks engage.

8. An electronic device comprising a solid image capture device including:
- a solid image capture element;
- a wiring board to which the solid image capture element is mounted, the wiring board including wiring for electrical connection with the solid image capture element;
- a transparent lid section provided over the solid image capture element to cover a light receiving section of the solid image capture element with a gap being left between the transparent lid section and the light receiving section; and
- a holder provided on the wiring board to encase therein the solid image capture element except for the light receiving section, wherein
the holder is anchored to the wiring board to hold down the transparent lid section in a direction normal to a light receiving surface of the solid image capture element toward the solid image capture element, wherein:
either the holder or the solid image capture element has a connecting section for electrical connection between the holder and the solid image capture element; and
the connecting section comes into contact with the holder and the solid image capture element when the holder is anchored to the wiring board.

* * * * *